(12) United States Patent
Im

(10) Patent No.: US 7,622,370 B2
(45) Date of Patent: Nov. 24, 2009

(54) PROCESS AND SYSTEM FOR LASER CRYSTALLIZATION PROCESSING OF FILM REGIONS ON A SUBSTRATE TO MINIMIZE EDGE AREAS, AND A STRUCTURE OF SUCH FILM REGIONS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 52 days.

(21) Appl. No.: 10/525,297

(22) PCT Filed: Aug. 19, 2003

(86) PCT No.: PCT/US03/25954

§ 371 (c)(1),
(2), (4) Date: Feb. 15, 2005

(87) PCT Pub. No.: WO2004/017381

PCT Pub. Date: Feb. 26, 2004

(65) Prior Publication Data

US 2006/0030164 A1   Feb. 9, 2006

Related U.S. Application Data

(60) Provisional application No. 60/405,085, filed on Aug. 19, 2002.

(51) Int. Cl.
*H01L 21/20* (2006.01)
(52) U.S. Cl. .................. 438/487; 438/486; 438/166
(58) Field of Classification Search .............. 438/486, 438/487, 166
See application file for complete search history.

(56) References Cited

U.S. PATENT DOCUMENTS 3,632,205 A    1/1972    Marcy (Continued)

FOREIGN PATENT DOCUMENTS

DE    19839718    3/2000

(Continued)

OTHER PUBLICATIONS

U.S. Appl. No. 60/253256, filed Aug. 31, 2003, Im.

(Continued)

*Primary Examiner*—Kevin M Picardat
*Assistant Examiner*—Bac H Au

(57) ABSTRACT

A process and system for processing a thin film sample are provided. In particular, a beam generator can be controlled to emit at least one beam pulse. The beam pulse is then masked to produce at least one masked beam pulse, which is used to irradiate at least one portion of the thin film sample. With the at least one masked beam pulse, the portion of the film sample is irradiated with sufficient intensity for such portion to later crystallize. This portion of the film sample is allowed to crystallize so as to be composed of a first area and a second area. Upon the crystallization thereof, the first area includes a first set of grains, and the second area includes a second set of grains whose at least one characteristic is different from at least one characteristic of the second set of grains. The first area surrounds the second area, and is configured to allow an active region of a thin-film transistor ("TFT") to be provided at a distance therefrom.

14 Claims, 15 Drawing Sheets

U.S. PATENT DOCUMENTS

| | | |
|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bolzer et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi et al. |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Kirk et al. |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,750,424 B2 | 6/2004 | Tanaka |
| 6,767,804 B2 | 7/2004 | Crowder |

| | | |
|---|---|---|
| 6,770,545 B2 | 8/2004 | Yang |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,961,117 B2 | 11/2005 | Im |
| 6,962,860 B2 | 11/2005 | Yamazaki et al. |
| 7,078,281 B2 | 7/2006 | Tanaka et al. |
| 7,091,411 B2 | 8/2006 | Falk et al. |
| 7,144,793 B2 | 12/2006 | Gosain et al. |
| 7,187,016 B2 | 3/2007 | Arima |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,341,928 B2 | 3/2008 | Im |
| 2001/0001745 A1 | 5/2001 | Im et al. |
| 2001/0041426 A1 | 11/2001 | Im |
| 2002/0083557 A1 | 7/2002 | Jung |
| 2002/0096680 A1* | 7/2002 | Sugano et al. ............... 257/66 |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0000455 A1 | 1/2003 | Voutsas |
| 2003/0003242 A1* | 1/2003 | Voutsas .................... 427/554 |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059265 A1 | 3/2005 | Im |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2006/0030164 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0215942 A1 | 9/2007 | Chen et al. |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 4279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11281997 | 10/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | WO 0171791 | 9/2001 |
| WO | WO 0197266 | 12/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 0346965 | 6/2003 |
| WO | 2003084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004/075263 | 9/2004 |
| WO | WO2005029546 | 3/2005 |
| WO | WO2005029548 | 3/2005 |
| WO | WO2005029550 | 3/2005 |
| WO | WO2005029551 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).*

Crowder et al., "Low-Temperature Single-Crystal Si TFT's Fabricated on Si Films processed via Sequential Lateral Solidification", IEEE Electron Device Letter, vol. 19 (8), p. 306 (1998).*

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.*

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, Pa.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH. 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliability," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of Al-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part I, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).*

N. Yamamuchi and R. Reif, Journal of Applied Physics, "Polycrystalline silicon thin films processed with silicon ion implantation and subsequent solid-phase crystallization: Theory, experiments, and thin-film transistor applications" —Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.*

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed poly-silicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15,1983.

Hayzelden, C. and J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, application # 60/503419; ref. file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. And H.I. Smith, Surface-energy-driven secondary grain growth in ultrathin (<100 nm) films of silicon, Appl. Phys. Lett. 44, 603 (1984).

Van Der Wilt, P.C., "Textured poly-Si films for hybrid SLS," Jul. 2004, pp. 1-5.

Van Der Wilt, P.C., "State-of-the-Art Laser Crystallization of Si for Flat Panel Displays," PhAST, May 18, 2004, pp. 1-34.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

U.S. Appl. No. 12/556,451, filed Sep. 9, 2009, Im.

* cited by examiner

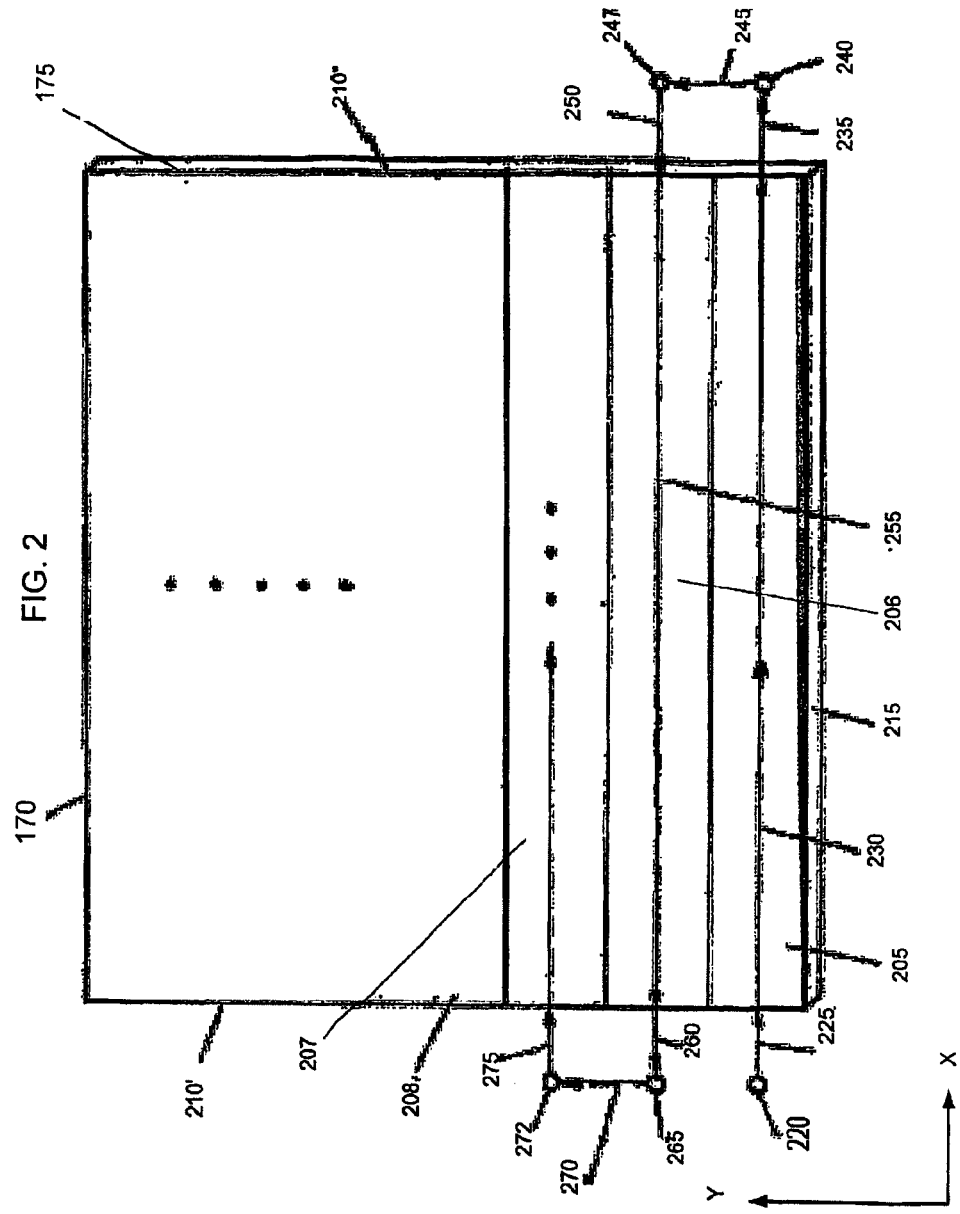

PROCESS AND SYSTEM FOR LASER CRYSTALLIZATION PROCESSING OF FILM REGIONS ON A SUBSTRATE TO MINIMIZE EDGE AREAS, AND A STRUCTURE OF SUCH FILM REGIONS

RELATED APPLICATION

This application is a national phase of International Patent Application No. PCT/US03/025954, filed Aug. 19, 2003, published on Feb. 26, 2004 as International Patent Publication No. WO 04/017381, which claims priority from U.S. Provisional Application No. 60/405,085, which was filed on Aug. 19, 2002, each of which are incorporated by reference in their entireties herein, and from which priority is claimed.

NOTICE OF GOVERNMENT RIGHTS

The U.S. Government may have certain rights in this invention pursuant to the terms of the Defense Advanced Research Project Agency award number N66001-98-1-8913.

FIELD OF THE INVENTION

The present invention relates to techniques for processing of thin films, and more particularly to techniques for processing semiconductor thin films to reduce non-uniform edge areas of the crystallized regions of the thin film so that at least an active region of an electronic devices, such as a thin-film transistor ("TFT"), can be placed away from such non-uniform edge areas.

BACKGROUND OF THE INVENTION

Semiconductor films, such as silicon films, are known to be used for providing pixels for liquid crystal display devices and organic light emitting diode displays. Such films have previously been processed (i.e., irradiated by an excimer laser and then crystallized) via excimer laser annealing ("ELA") methods. However, the semiconductor films processed using such known ELA methods often suffer from microstructural non-uniformities such as edge effects, which manifest themselves in availing a non-uniform performance of thin-film transistor ("TFT") devices fabricated on such films.

Such non-uniformity in edge regions is particularly problematic in that the visual transitions between the neighboring pixels corresponding to the irradiated and crystallized areas of the semiconductor thin film on the liquid crystal displays ("LCDs") or organic light emitting diode displays are not as smooth as could be desired, and may even be visible in certain cases, which is undesired. This is also because the edge effects promote a low performance in TFT devices whose active regions are provided thereon.

Significant efforts have been made into the refinement of "conventional" ELA (also known as line-beam ELA) processes in the attempt to reduce or eliminate non-uniformities on the crystallized areas of the semiconductor thin film. For example, U.S. Pat. No. 5,766,989 issued to Maegawa et al., the entire disclosure of which is incorporated herein in its entirety by reference, describes the ELA methods for forming polycrystalline thin film and a method for fabricating a thin-film transistor. This publication attempts to address the problem of non-uniformity of characteristics across the substrate, and provide certain options for apparently suppressing such non-uniformities. However, details of previous approaches make it impossible to completely eliminate the non-uniformities that are introduced from the edge areas (which are typically between 100 μm to 1,000 μm or higher). Thus, the cross sectional area of the portions of the semiconductor thin film on which the TFT devices could be placed would be significantly reduced due to such disadvantageous edge effects causing large non-uniform edge areas which border these portions.

For example, one such conventional ELA process uses a long and narrow shaped beam 800 as shown in FIGS. 11A and 11B. The fluence of this beam 800 is above a melting level in a center portion 810 thereof, while side areas 820 of this beam 800 have a fluence that is gradually reduced at the edges thereof. The width of the center portion 810 of the beam 800 may be 1 cm and the length thereof may be 30 cm. In this manner, the beam can potentially irradiate the entire semiconductor thin film during one pass across it. As shown in FIG. 11B, portions 830 of the side areas 820 of the beam 800 can be provided between the melting level and the crystallization threshold. Thus, when the beam 800 irradiates particular portions of the semiconductor thin film which is then crystallized, such portions would likely have an edge regions in thus irradiated and crystallized areas of the semiconductor thin film that are likely to have large non-uniform edge regions spatially corresponding to the portions 830 of the beam 800. The edge regions are known to be disadvantageous for placing the TFT devices (and especially their active regions) thereon.

Attempts have been made to eliminate the edge effect (i.e., non-uniformity of the edge areas) of the irradiated and crystallized portions of the semiconductor film. U.S. Pat. No. 5,591,668 issued to Maegawa et al. tries to minimize these edge areas by using a substantially square shaped beams (rotated 45° and having rounded peaks) that sequentially overlap one another using a laser annealing method. However, such conventional procedure would require multiple irradiation by the beam pulses of the same areas, and the processing of the semiconductor film would be somewhat slow.

Accordingly, it is preferable to irradiate and crystallize at least some of the areas of the semiconductor films by passing the beam pulses through a mask in a way so as to eliminate the problem caused by such edge effect by clearly defining the profile of the beam pulse. It is preferable to significantly reduce the spatial scale associated with the edge region so as to make it possible to have such regions be provided away from the active regions of the TFT devices. In addition, multiple irradiations of the same area on the semiconductor film would therefore no longer be necessary.

SUMMARY OF THE INVENTION

Therefore, one of the objects of the present invention is to provide an improved process and system which can make the edge regions of the crystallized areas of the semiconductor thin film relatively small (e.g., one such region can be smaller than the distance between the adjacent TFT devices). Thus, it is possible to place the active regions of the TFT devices on the semiconductor thin film away from these edge regions. Another object of the present invention is to increase the speed to process the semiconductor films for their use with the liquid crystal displays and/or organic light emitting diode displays. Still another object of the present is to have a capability for utilizing various fluences of the beam pulse for irradiating the areas of the semiconductor thin film, so long as such fluence induces a crystallization of the irradiated areas of the semiconductor thin film.

In accordance with at least some of these objectives as well as others that will become apparent with reference to the following specification, it has now been determined that the reduction the size of the edge regions of the irradiated and crystallized areas of the semiconductor thin film is advantageous to, reduce the edge effect. It was also ascertained that the grains provided in the edge regions of such areas are different from the grains of the areas that are arrangement, e.g., between two oppositely-spaced edge regions of the semiconductor thin film. Further, it was determined that the use of the two-dimensional mask to pass the beam pulse there through configured the profile of the resultant masked beam pulse to be well defined, thus decreasing or eliminating the portion of the beam pulse which may have a gradually-reducing fluence level that may cause the undesired edge effect.

In one exemplary embodiment of the present invention, a process and system for processing a semiconductor thin film sample are provided. In particular, a beam generator can be controlled to emit at least one beam pulse. The beam pulse is then masked to produce at least one masked beam pulse, which is used to irradiate at least one portion of the semiconductor thin film sample. With the at least one masked beam pulse, the portion of the film sample is irradiated with sufficient intensity for such portion to later crystallize. This portion of the film sample is allowed to crystallize so as to be composed of a first area and a second area. Upon the crystallization thereof, the first area includes a first set of grains, and the second area includes a second set of grains whose at least one characteristic is different from at least one characteristic of the second set of grains. The first area surrounds the second area, and is configured to allow an active region of a thin-film transistor ("TFT") to be provided at a distance therefrom.

In another embodiment of the present invention, the masked beam pulse can have the intensity sufficient to completely melt the irradiated portion of the semiconductor thin film sample throughout its thickness (or partially melt such portion). The active region of the TFT can be situated within the second area. The second area may correspond to at least one pixel. The second area has a cross-section for facilitating thereon all portions of the TFT. A size and a position of the first area with respect to the second area are provided such that the first area provides either no effect or a negligible effect on a performance of the TFT.

According to still another embodiment of the present invention, a location of the first area can be determined so as to avoid a placement of the active region of the TFT thereon. The beam pulse may include a plurality of beamlets, and the first and second areas can be irradiated by the beamlets. The semiconductor thin film sample may be a silicon the film sample. The semiconductor thin can be composed of at least one of silicon and germanium, and may have a thickness approximately between 100 Å and 10,000 Å. The first set of grains provided in the first area may be laterally-grown grains.

According yet another embodiment of the present invention, a semiconductor thin film sample includes at least one section irradiated by at least one masked beam pulse which is configured to irradiate the at least one section of the sample for a later crystallization thereof. The irradiated portion of the film sample is crystallized to include a first area and a second area. Upon the crystallization thereof, the first area includes a first set of grains, and the second area includes a second set of grains whose at least one characteristic is different from at least one characteristic of the second set of grains. The first area surrounds the second area, and is configured to allow an active region of a thin-film transistor ("TFT") to be provided at a distance therefrom.

The accompanying drawings, which are incorporated and constitute part of this disclosure, illustrate a preferred embodiment of the invention and serve to explain the principles of the invention.

BRIEF DESCRIPTION OF THE DRAWINGS

FIG. 2 is a top exploded view of an exemplary embodiment of the sample conceptually subdivided, and having a semiconductor thin film thereon on which a process according to the present invention is performed for the entire surface area a semiconductor thin film using the exemplary system of FIG. 1A;

DETAILED DESCRIPTION

It should be understood that various systems according to the present invention can be utilized to mask, irradiate and crystallize one or more portions on the semiconductor (e.g., silicon) film so as to reduce edge areas of these portions and to place at least an active region of a thin-film transistor ("TFT") away from the edge regions of such portions. The exemplary embodiments of the systems and process to achieve such areas as well as of the resulting crystallized semiconductor thin films shall be described in further detail below. However, it should be understood that the present invention is in no way limited to the exemplary embodiments of the systems processes and semiconductor thin films described herein.

Figure 1A:
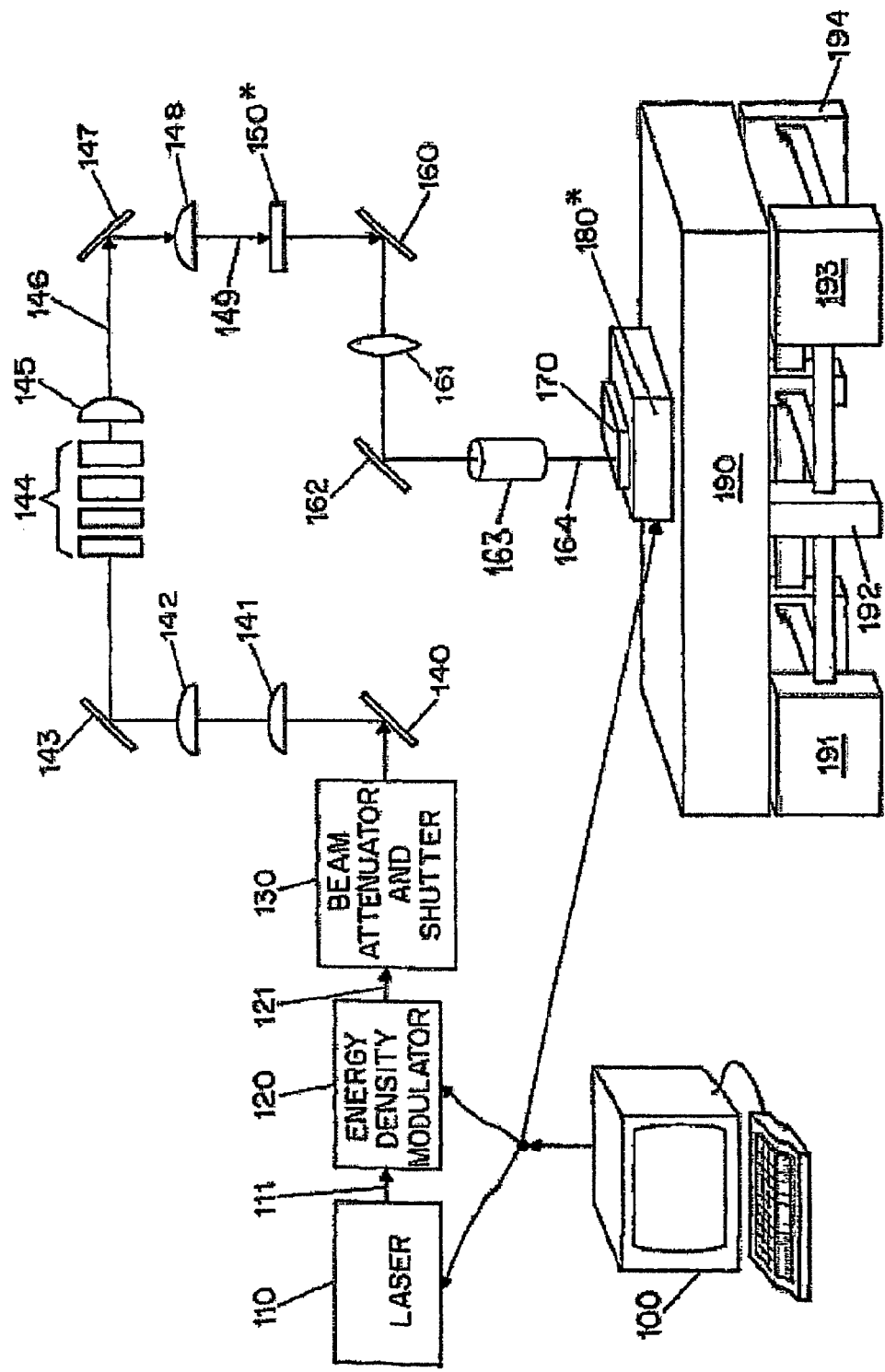
FIG. 1A is a schematic block diagram of an exemplary embodiment of an irradiation system according to the present invention which irradiates particular areas of a semiconductor thin film of a sample such that these areas have a relatively small edge regions.

In particular, FIG. 1A shows a system according to the present invention which is used on a sample 170 which has an amorphous silicon thin film thereof that is being irradiated by masked irradiation beam pulses to promote the masked irradiation, solidification and crystallization of the particular areas of the semiconductor thin film in which the edge regions are minimized. The exemplary system includes a beam source 110 (e.g., a Lambda Physik model LPX-315I XeCl pulsed excimer laser) emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×-6× eye piece 161, a controllable shutter 152, a multi-element objective lens 163 for focusing a radiation beam pulse 164 onto the sample 170 having the semiconductor thin film to be processed mounted on a sample translation stage 180, a granite block optical bench 190 supported on a vibration isolation and self-leveling system 191, 192, 193 and 194, and a computing arrangement 100 (e.g., a general purpose computer executing a program according to the present invention or a special-purpose computer) coupled to control the beam source 110, the beam energy density modulator 120, the variable attenuator 130, the shutter 152 and the sample translation stage 180.

The sample translation stage 180 is preferably controlled by the computing arrangement 100 to effectuate translations of the sample 170 in the planar X-Y directions, as well as in the Z direction. In this manner, the computing arrangement 100 controls the relative position of the sample 40 with respect to the irradiation beam pulse 164. The repetition ad the energy density of the irradiation beam pulse 164 are also controlled by the computer 100. It should be understood by those skilled in the art that instead of the beam source 110 (e.g., the pulsed excimer laser), the irradiation beam pulse can be generated by another known source of short energy pulses suitable for completely melting throughout their entire thickness selected areas of the semiconductor (e.g., silicon) thin film of the sample 170 in the manner described herein below. Such known source can be a pulsed solid state laser, a chopped continuous wave laser, a pulsed electron beam and a pulsed ion beam, etc. Typically, the radiation beam pulses generated by the beam source 110 provide a beam intensity in the range of 10 mJ/cm$^2$ to 1 J/cm$^2$ (e.g., 500 mJ/cm$^2$) a pulse duration (FWHM) in the range of 10 to 103 nsec, and a pulse repetition rate in the range of 10 Hz to 104 Hz.

While the computing arrangement 100, in the exemplary embodiment of the system shown in FIG. 1A, controls translations of the sample 170 via the sample stage 180 for carrying out the processing of the semiconductor thin film of the sample 170 according to the present invention, the computing arrangement 100 may also be adapted to control the translations of the mask 150 and/or the beam source 110 mounted in an appropriate mask/laser beam translation stage (not shown for the simplicity of the depiction) to shift the intensity pattern of the irradiation beam pulses 164, with respect to the semiconductor thin film of the sample 170, along a controlled beam path. Another possible way to shift the intensity pattern of the irradiation beam pulse is to have the computer 100 control a beam steering mirror. The exemplary system of FIG. 1 may be used to carry out the processing of the silicon thin film of the sample 170 in the manner described below in further detail. It should also be understood that it is possible to exclude the mask 150 from the system according to the present invention. Without such mask 150, the beam source 110, the energy density modulator, the beam attenuator and/or other components of the system of the present invention can be used to shape the beam 149 so as to impinge and irradiate selected portions of the semiconductor thin film of the sample 170.

Figure 1B:
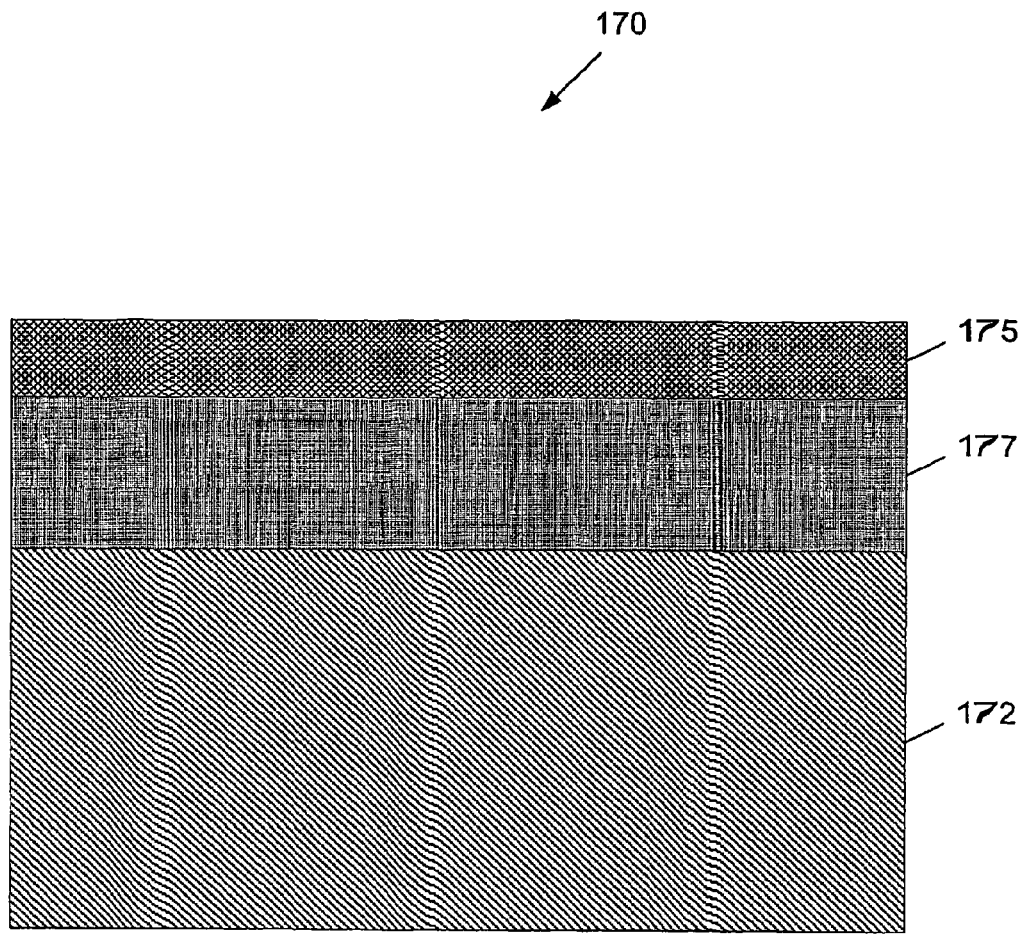
FIG. 1B is an enlarged cross-sectional side view of the sample which includes the semiconductor thin film.

As illustrated in FIG. 1B, the semiconductor thin film 175 of the sample 170 can be directly situated on e.g., a glass substrate 172, and may be provided on one or more intermediate layers 177 there between. The semiconductor thin film 175 can have a thickness between 100 Å and 10,000 Å (1 μm) so long as at least certain necessary areas thereof can be completely melted throughout their entire thickness. According to an exemplary embodiment of the present invention, the semiconductor thin film 175 can be composed of silicone germanium, silicon germanium (SeGe) all of which preferably having low levels of impurities. It is also possible to utilize other elements or semiconductor materials for the semiconductor thin film 175. The intermediary layer 177, which is situated immediately underneath the semiconductor thin film 175, can be composed of silicon oxide ($SiO_2$), silicon nitride ($Si_3N_4$), and/or mixtures of oxide, nitride or other materials that are suitable for promoting nucleation and small grain growth within the designated areas of the semiconductor thin film 175 of the sample 170. The temperature of the glass substrate 172 can be between room temperature and 800° C. Higher temperatures of the glass substrate 172 can be accomplished by preheating the substrate 172 which would effectively allow larger grains to be grown in the nucleated, resolidified, and then crystallized areas of the semiconductor thin film 175 of the sample 170 due to the proximity of the glass substrate 172 to the thin film 175.

FIG. 2 shows an enlarged view of an exemplary embodiment of the semiconductor thin film 175 (e.g., an amorphous silicon thin film) of the sample 170, and the relative translation paths of the beam pulse 164 with respect to the locations on the sample 170. This exemplary sample 170 has exemplary dimensions of 40 cm in the Y direction by 30 cm in the X direction. The sample 170 can be conceptually subdivided into a number of columns (e.g., a first conceptual column 205, a second conceptual column 206, a third conceptual column 207, etc.). The location/size of each conceptual column may be stored in a storage device of the computing arrangement 100, and utilized by the computing 100 for later controlling the translation of the sample 170, and/or firing of the beam in by the beam source 110 at such relative locations of the semiconductor thin film 175, or on other locations that are based on the stored locations. Each of the conceptual columns 205, 206, 207, etc. is dimensioned, e.g., ½ cm in the Y direction by 30 cm in the X direction. Thus, if the sample 170 is sized 40 cm in the Y direction, the sample 150 may be conceptually subdivided into eighty (80) columns. The sample 170 may also be conceptually subdivided into such columns having other dimensions (e.g., 1 cm by 30 cm columns, 2 cm by 30 cm columns, 2 cm by 30 cm columns, etc.). In fact, there is absolutely no restrictions on the dimensions of the conceptual columns of the sample 170 so long as the masked beam pulse 164 is capable of irradiating certain areas of the semiconductor thin film 175 in such columns to promote crystallization within such areas.

In particular, according to the present invention, it is important to provide relatively small edges region at the peripheries of these areas of the film sample 175 so as to allow at least the active region of the TFT device to be placed away from these very small edge regions. The small size of the edge regions is primarily due to the use of the mask 150 to generate a sharp pro, file of the beam 111 as the masked beam pulse 164 The location/dimension of each conceptual column, and the locations thereof, are stored in the storage device of the computing arrangement 100, and utilized by such computing arrangement 100 for controlling the translation of the translation stage 180 with respect to the beam pulse 164 and/or the firing of the beam 111 by the beam source 110 at those locations of the semiconductor thin film sample, or on other locations.

Figure 3:
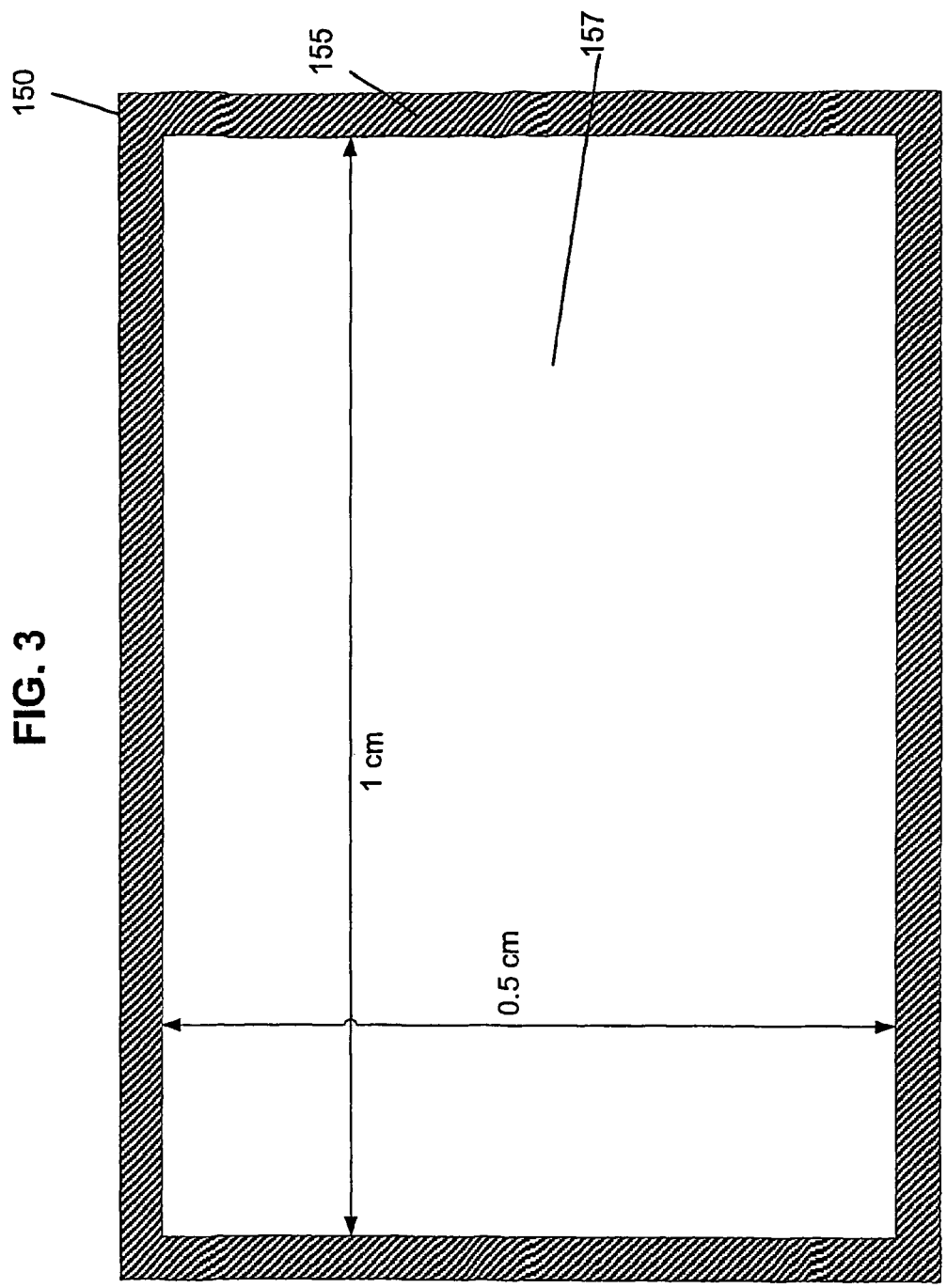
FIG. 3 is a top view of a first exemplary embodiment of a mask according to the present invention which has a beam-blocking area surrounding one open or transparent area, and which can be used with the exemplary system of FIG. 1A to mask the beam pulses generated by a laser beam source into a patterned beam pulse, such that such masked beam pulses irradiate the particular areas on the semiconductor film thereby reducing the edge regions provided at the peripheries of such areas.
Figure 12:
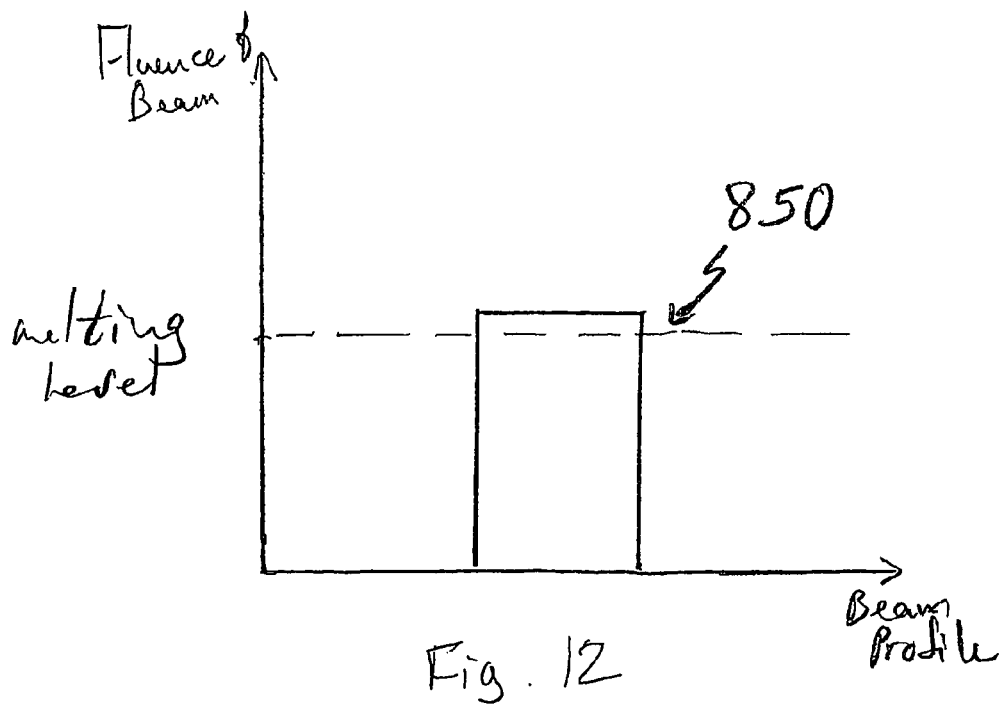
FIG. 12 is a exemplary graph of the fluence of the beam against the spatial profile of the beam generated by the system and process according to the present invention which reduces the edge regions of the particular portions of the semiconductor thin film irradiated by such beam.

For example, the semiconductor thin film 175 cam be irradiated by the beam pulse 164 whose profile is defined using the mask 150 according to a first exemplary embodiment of the present invention as shown in FIG. 3. The first exemplary mask 150 is sized such that its cross-sectional area is larger than that of the cross-sectional area of the masked beam pulse 164. In this manner, the mask 150 can pattern the pulsed beam to have a shape and profile directed by the open or transparent regions of the mask 150. This can be commonly referred to as a "two-dimensional projection", which generally the shape of the beam, and reduces such shape in all directions. Such projection is significantly different from a single axis projection which does not utilize a mask, and merely shapes and reduces the beam in one direction FIG. 12 show a preferable profile 850 of the masked beam pulse 164 as the pulse 149 is passed through the mask 150. This profile 850 is well defined so as to minimize the edge regions provided at the peripheries of the irradiated portions of the semiconductor thin film 175.

In this exemplary embodiment shown in FIG. 3, the mask 150 includes a beam-blocking section 155 and an open or transparent section 157. The beam-blocking section 155 prevents those areas of the pulsed beam impinging such section 155 from being irradiated there-through, thus preventing the further entering the optics of the exemplary system of the present invention shown in FIG. 1A to irradiate the corresponding areas of the semiconductor thin film 175 provided on the sample 170. In contrast, the open or transparent section 157 allows the portion of the beam pulse 164 whose cross-section corresponds to that of the section 157 to enter the optics of the system according to the present invention, and irradiate the corresponding areas of the semiconductor thin film 175. In this manner, the mask 150 is capable of patterning the beam pulse 164 so as to impinge the semiconductor thin film 175 of the sample 170 at predetermined portions thereof as shall be described in further detail below.

According to the present invention, the masked beam pulse 164 can have various energy fluences. For example, such fluence of the masked beam pulse 164 can small, but which promotes an explosive crystallization. The fluence of the beam pulse 164 can be higher than the small fluence to promote partial melting of the irradiated portions of the semiconductor thin film 175, and then crystallization of such portions. In addition, the fluence can be higher than the fluence promoting partial melting so as to allow a near-complete melting of the portions of the semiconductor thin film 175. Furthermore, the fluence of the masked beam pulse 164 can be high enough to completely melt the above-described irradiated portions of the thin film 175. In summary, the fluence should be large enough to allow the portions of the semiconductor thin film 175 to crystallize after being irradiated by the masked beam pulse 164.

A first exemplary embodiment of the process according to the present invention shall now be described with reference to the irradiation of the semiconductor thin film 175 of the sample 170 as illustrated in FIGS. 4A-4F. In this exemplary process of the present invention, the beam pulse 149 is shaped by the exemplary mask 150 of FIG. 3, and the exemplary irradiation and/or impingement of the semiconductor thin film 175 of the sample 170 is shown in FIG. 2. For example, the sample 170 may be translated with respect to the beam pulse 164, either by moving the mask 150 or the sample translation stage 180, in order to irradiate selective areas of the semiconductor thin film 175 of the sample 170. For the purposes of the foregoing, the length and width of the laser beam 149 may be greater than 1 cm in the X-direction by ½ cm in the Y-direction (e.g., a rectangular shape) so that it can be shaped by the mask 150 of FIG. 3. However, it should be understood the pulsed laser beam 149 is not limited to such shape and size. Indeed, other shapes and/or sizes of the laser beam 149 are, of course, achievable as is known to those having ordinary skill in the art (e.g., shapes of a square, triangle, circle, etc.).

After the sample 170 is conceptually subdivided into columns 205, 206, 207, etc., a pulsed laser beam 111 is activated (by actuating the beam source 110 using the computing device 100 or by opening the shutter 130), and produces the pulsed laser beamlets 164 which impinges on a first location 220 which is away from the semiconductor thin film 175. Then, the sample 170 is translated and accelerated in the forward X direction under the control of the computing arrangement 100 to reach a predetermined velocity with respect to the fixed position beamlets in a first beam path 225.

In one exemplary variation of the process of the present invention, the pulsed beamlets 164 can reach a first edge 210' of the sample 170 preferably when the velocity of the movement of the sample 170 with respect to the pulsed laser beam 149 reaches the predetermined velocity. Then, the sample 170 is continuously (i.e., without stopping) translated in the −X direction at the predetermined velocity so that the pulsed beamlets 164 continue irradiating successive portions of the sample 170 for an entire length of a second beam path 230.

Figure 4A:
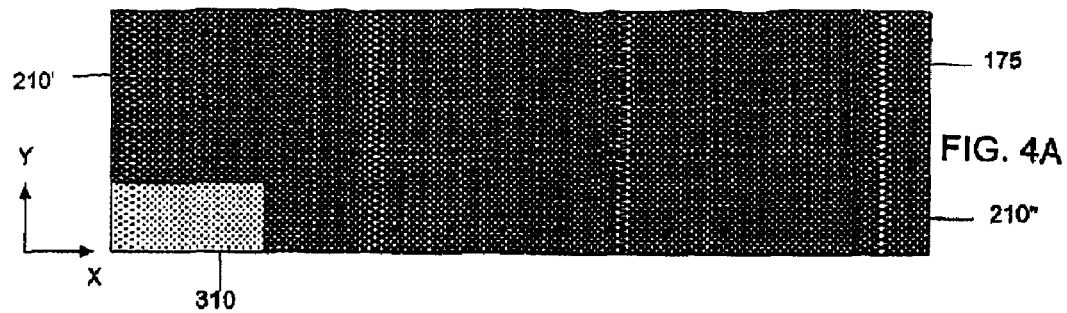
FIGS. 4A-4D are irradiations, by the radiation beam pulse which is masked by the mask of FIG. 3, and then re-solidifications and crystallizations of the particular portions of the semiconductor film provided on the sample for an first exemplary conceptual column of the sample at various sequential stages of the exemplary embodiment according to the process of the present invention in which the edge regions of the particular portions are significantly reduced.
Figure 4B:
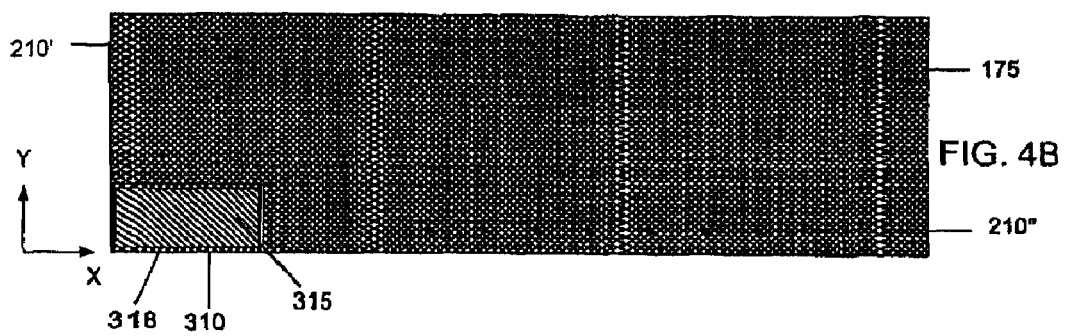

After passing the first edge 210', the beam pulse 164 impinges and irradiates a first area 310 of the semiconductor thin film 175, preferably with enough intensity to irradiate such area so that the crystallization thereof is then promoted, as illustrated in FIG. 4A. The fluence of the masked beam pulse 164 should preferably be large enough to promote crystallization of the irradiated portions of the semiconductor thin film 175. Then, as shown in FIG. 4B, this first area 310 is allowed to crystallize, thereby forming two regions therein—a first center region 315 and a first minimized edge region 318. The first center region 315 is formed after the irradiation of the first area 310 by the masked beam pulse 164. The dimensions of this center region 315 are slightly smaller that the dimensions of the masked beam pulse 164 irradiating the first area 310, with the first center region 315 being surrounded by the first edge region 318 (the details of which are described herein below). Again, the size of the first edge region 318 is minimized due to the masking of the beam pulse 149 to become the masked beam pulse 164 which preferably has the profile 850 illustrated in FIG. 12. It should be note that the characteristics of the grains (e.g., length, orientation, etc.) of the first center area 315 and the characteristics of the first edge area 318 are different; such differences is one of the main reasons for the reduction of the edge regions.

Figure 11A:
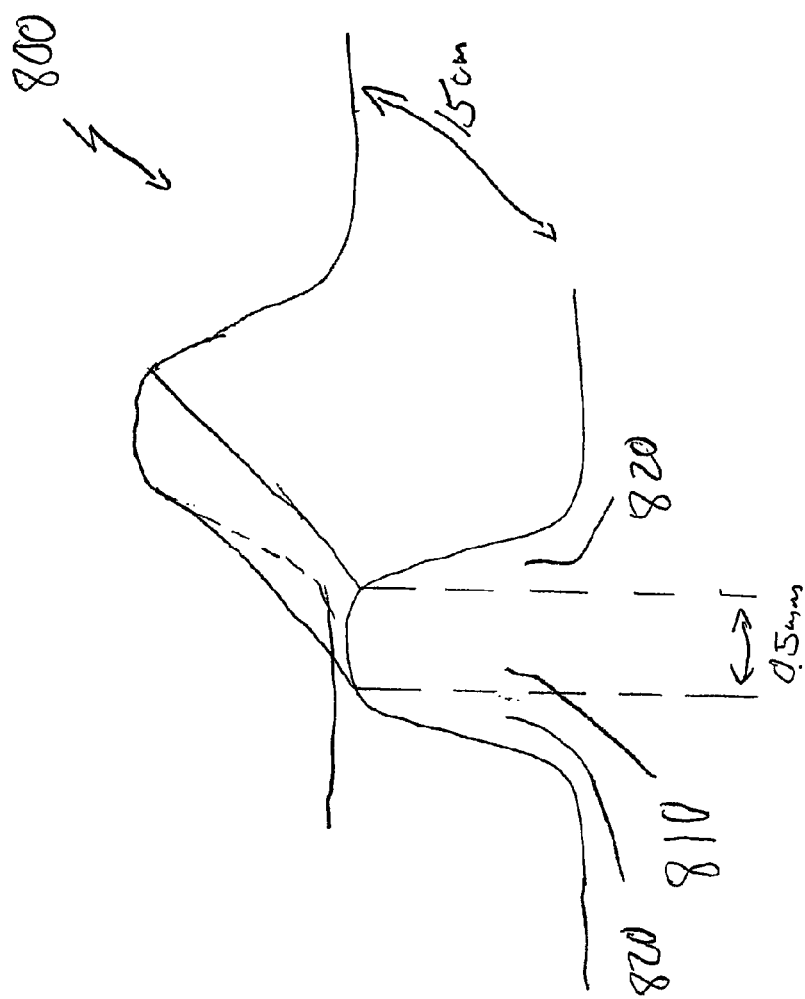
FIG. 11A is a perspective cut-away view of a profile of a long and narrow beam which is shaped by a projection irradiation using conventional systems amid processes.
Figure 11B:
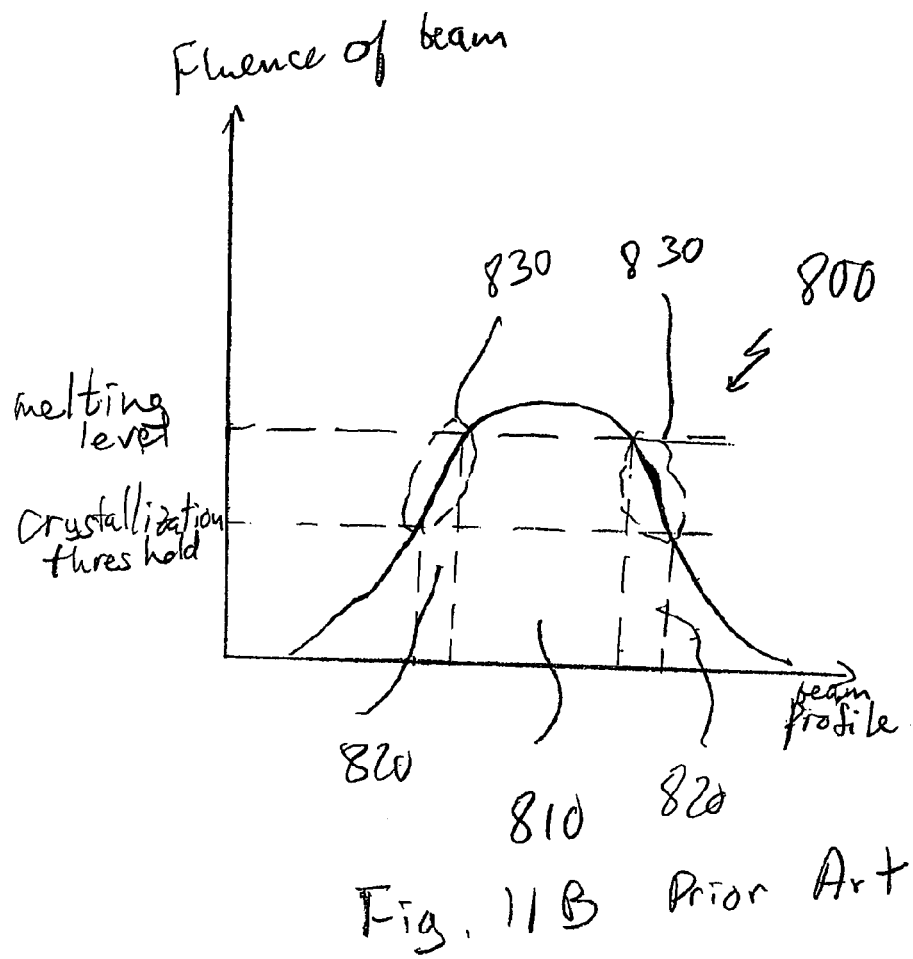
FIG. 11B is a graph of the fluence of the beam of FIG. 11A against the spatial profile of the beam generated by the conventional systems and processes.

The first edge region 318 can formed by laterally growing the grains from the borders between the unirradiated portions of the semiconductor thin film 175 and the first irradiated area 310. This is the case when the masked beam pulse 164 has the fluence to completely melt the first area 310. The grains in the first center region 318 grown from these borders toward the center of the first melted area for a predetermined small distance, to reach the first center region 315, and form a border there between. Of course, it should be understood that if the masked beam pulse 164 does not have enough intensity to completely melt the first area, grains are formed in the first edge region in any event. Generally, the grains of the first center region 315 are larger than those in the first edge region 318. This is preferably because the intensity of the masked beam pulse 164 is greater in the center thereof than at the edges. The predetermined distance is small because the beam pulse 149 is irradiated through the mask 149 to form the masked beam pulse 164 which does not have large gradually decreasing edge portions (e.g., portions 820 of the conventional beam pulse 800 as shown in FIGS. 11A and 11B), and in fact preferable has the intensity pattern 850 illustrated in FIG. 12. For example, the predetermined distance can be 1 μm, while the width of the first center region may be slightly less than 1 cm. Therefore, the first edge region 318 is significantly smaller that the first center region 315 which it surrounds. For the purposes of the present invention, it is undesirable to position the active regions of the TFT devices on such edge regions, so that the active regions (and possibly the entire TFT devices) are placed away from these edge regions.

Figure 4C:
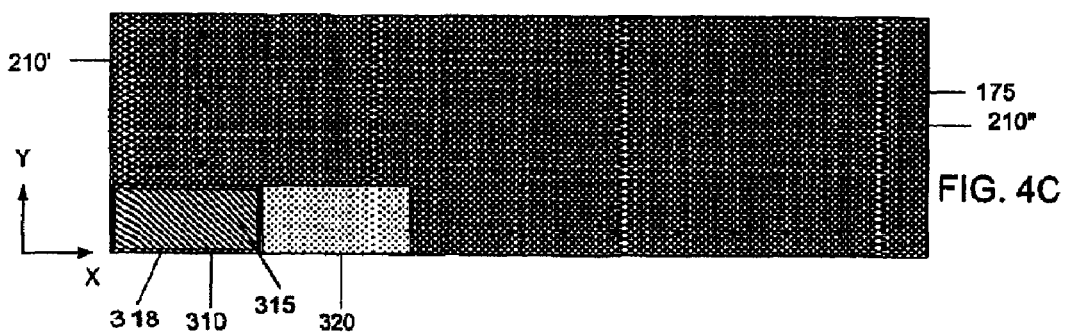

Thereafter, as shown in FIG. 4C, the sample 170 is continued to be translated (or the mask 150 is configured to be adjusted) such that the beam pulse 164 irradiates a second area 320 of the semiconductor thin film 175 in the manner discussed herein above for the first area 310. This second area 320 which can be a subsequent area immediately following the first area 320 in the first conceptual column 205 along the +X direction.

Figure 4D:
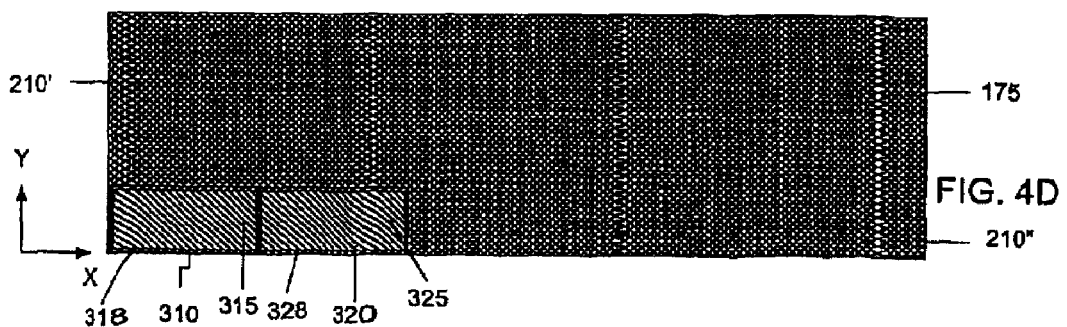

Similarly to the first area 310, the second area 320 crystallizes into a second center region 325 and a second edge region 328, which correspond to the characteristics and dimensions of the first center region 315 and the first edge region 318, respectively. If, during the irradiation of the second area 320 (and in an exemplary case of complete melting thereof), the masked beam pulse 164 slightly overlaps the first edge region 318, then upon crystallization, the grains in this region 318 seed and laterally grow a portion of the completed melted second area 320 which is immediately adjacent to the first edge region 318. In this manner, the adjacent section of the second edge region 328 is seeded by the first laterally-grown region 318 to laterally grow grains therefrom. Nevertheless, the second edge region 328 is still very small (e.g., 1 μm) as compared to the second center area 325. The resultant crystallized second area 320 is illustrated in FIG. 4D. It is also within the scope of the present invention for the second area 320 to be provided at a distance from the crystallized first area 310. In this manner and in case of the complete melting of the second area 320, the sections of the second edge region 328 which is situated closest to the crystallized first laterally-grown region 318 can be seeded by the grains from an unirradiated section between the first area 310 and the second area.

The first edge area 318 and/or the second edge area 328 are preferably sized such that the cross-sectional area thereof is smaller that the distance between the TFT device (especially the active regions thereof) which is situated in the first center region 315 and the TFT device situated in the second center region 325.

Figure 4E:
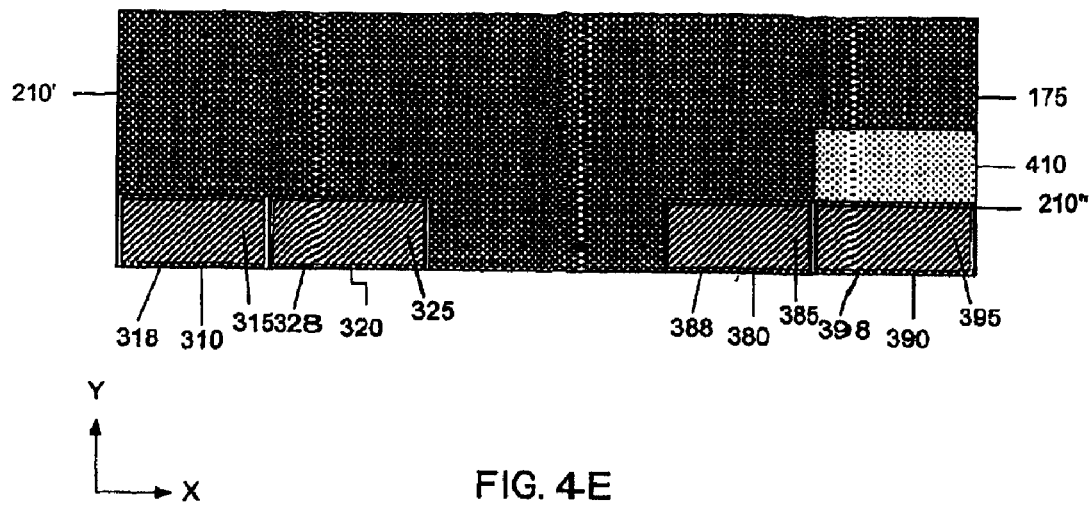
FIGS. 4E-4F are irradiations, by the radiation beam pulse which is masked by the mask of FIG. 3, and then re-solidifications and crystallizations of the particular portions of the semiconductor film provided on the sample for an second exemplary conceptual column of the sample at two exemplary sequential stages of the processing according to the process of the present invention, which continue from the first conceptual column of FIGS. 4A-4D.
Figure 4F:
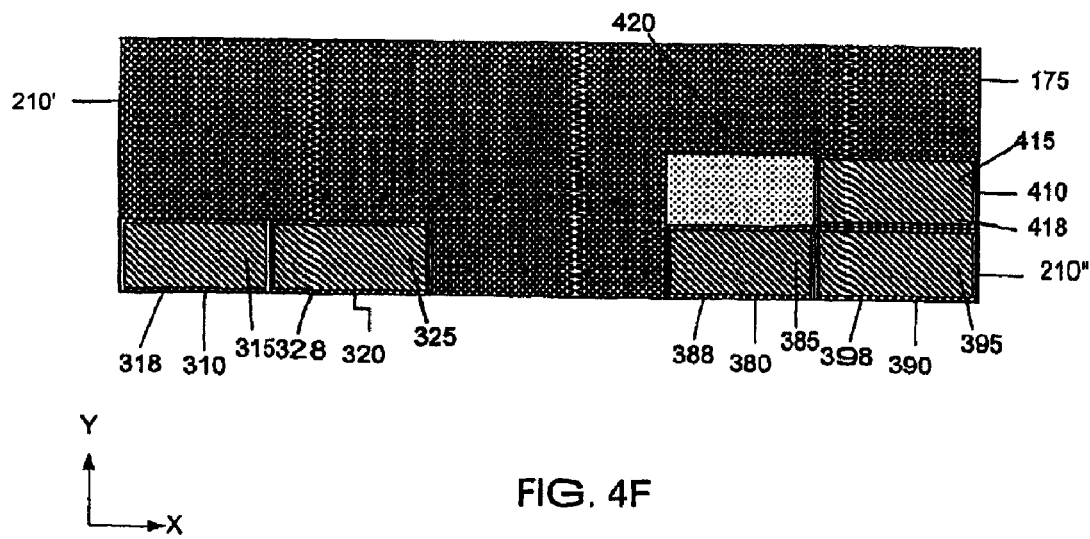

The translation and irradiation of the first conceptual column 205 of the semiconductor thin film 175 continues until all areas 310, 320, ..., 380, 390 (and their respective center regions 315, 325, ..., 385, 395 and edge regions 318, 328, ..., 388, 398) in this first conceptual column 205 is continued until the pulsed beamlets 164 reach a second edge 210" of the sample 170, as illustrated in FIG. 4E. The crystallization of the areas 310, 320, ..., 380, 390 along the first conceptual column 205 is performed in a substantially repetitive manner. When the beam pulse 164 passes the second edge 210", the translation of the sample 170 may be slowed with respect to the masked beam pulse 164 (in a third beam path 235) to reach a second location 240 (see FIG. 2). It should be noted that it is not necessary to shut down the pulsed beam 111 after the masked beam pulse 164 has crossed the second edge 210" of the sample 170 because it is no longer irradiating the sample 170.

While being away from the sample 170 and the second edge 210", the sample is translated in a −Y direction to a third location 247 via a fourth beam path 245 so as to be able to irradiate the sections of the semiconductor thin film 175 along the second conceptual column 206. Then, the sample 170 is allowed to settle at that location 247 to allow any vibrations of the sample 170 that may have occurred when the sample 170 was translated to the third location 247 to cease. Indeed, for the sample 170 to reach the second conceptual column 206, it is translated approximately ½ cm for the columns having a width (in the −Y direction) of ½ cm. The sample 170 is then accelerated to the predetermined velocity via a fourth beam path 250 in the −X direction so that the impingement of the semiconductor thin film 175 by the beam pulse 164 reaches, and then bypasses the second edge 210".

Thereafter, the sample 170 is translated along a fifth beam path 255, and the exemplary process described above with respect to the irradiation of the first column 205 may then be repeated for the second conceptual column 206 to irradiate further areas 410, 420, and their respective center regions 415, 425 and edge regions 418, 428 while translating the sample in the +X direction. In this manner, all conceptual columns of the sample 170 can be properly irradiated. Again, when the beam pulse 164 reaches the first edge 210', the translation of the sample 170 is decelerated along a sixth beam path 260 to reach a fourth location 265. At that point, the sample 170 is translated in the −Y direction along the seven beam path 270 for the beam pulse to be outside the periphery of the sample 170 to reach fifth location 272, and the translation of the sample 170 is allowed to be stopped so as to remove any vibrations from the sample 170. Thereafter, the sample 170 is accelerated along the eighth beam path 275 in the −X direction so that the beam pulse 164 reaches and passes the first edge 210' of the sample 170, and the beam pulse 164 irradiates (e.g., to partially or completely melt) certain areas in the third conceptual column 207 so that they can crystallize in substantially the same manner as described above for the areas 310, 320, . . . , 380, 390 of the first conceptual column 205 and the areas 410, 420, . . . of the second conceptual column 206.

This procedure may be repeated fox all conceptual column of the semiconductor thin film 175, for selective columns of particular sections of the thin film 175 which are not necessarily conceptually subdivided into columns. In addition, it is possible for the computing arrangement 100 to control the firing of the beam 111 by the beam source 110 based on the predefined location stored in the storage device of the computing arrangement 100 (e.g., instead of irradiating the semiconductor thin film 175 by setting predetermined time period between the beam pulses or setting pulse durations). For example, the computing arrangement 100 can control the beams source 110 to generate the beam 111 and irradiate only at the predetermined locations of certain areas of the thin film 175 with its corresponding beam pulse 164, such that these locations are stored and used by the computing arrangement 100 to initiate the firing of the beam 111 which results in the irradiation by the beam pulse only when the sample 170 is translated to situate those areas directly in the path of the beam pulse 164. The beam source 110 can be fired via the computing arrangement 100 based on the coordinates of the location in the X direction.

In addition, it is possible to translate the sample 170 in a manner which is not necessary continuous, when the path of the irradiation of the beam pulse 164 points to the areas on the semiconductor thin film 175 to be melted and crystallized. Thus, it is possible for the translation of the sample 170 to be stopped in the middle of the sample 170, with the area in the middle being irradiated and then crystallized. Thereafter, the sample 170 can be translated so that another section of the semiconductor thin film 175 is arranged in the path of the beam pulse 164, such that the translation of the sample is then stopped again and the particular section is irradiated and completely melted in accordance with the exemplary embodiment of the process described in great detail above, as well as the embodiments of the process which shall be described below.

According to the present invention, any mask described and shown herein and those described and illustrated in U.S. patent application Ser. No. 09/390,535, the entire disclosure of which is incorporated herein by reference, may be used for the process and system according to the present invention. For example, instead of using the mask shown in FIG. 3 which allows the semiconductor thin film 175 to be flood-irradiated, a second exemplary embodiment of the mask 150' illustrated in FIG. 5A can be utilized. In contrast to the mask 150 of FIG. 3 which has a single open or transparent region 157, the mask 150' has multiple open or transparent regions 450 which are separated from one another by beam-blocking regions 455. The open or transparent regions 450 of the mask 150' can also be referred to as "slits." These slits permit small beam pulses (or beamlets) to irradiate there-through and completely melt the areas of the semiconductor thin film 175 that they impinge. An enlarged illustration of one of the slits 450 is provided in FIG. 5B, which shows that the dimensions of the slits 450 can be 0.5 μm by 0.5 μm. It should be clearly understood that other dimensions of the slits are possible, and are within the scope of the present invention. For example, the slits can have a rectangular shape, a circular shape, a triangular shape, a chevron shape, a diamond-shaped shape, etc. According to the present invention, the slits should be sufficiently large so that when the pulsed beamlets 164 formed thereby irradiate and crystallize the particular areas of the semiconductor thin film 175, the center portions (i.e., not the edge regions) are formed so as to situate the TFT devices (or at least their active regions) therein. It is important that the active regions of such situated TFT devices have respective distances from one another which are greater that the edge regions of the beamlet-irradiated and crystallized areas.

Figure 5A:
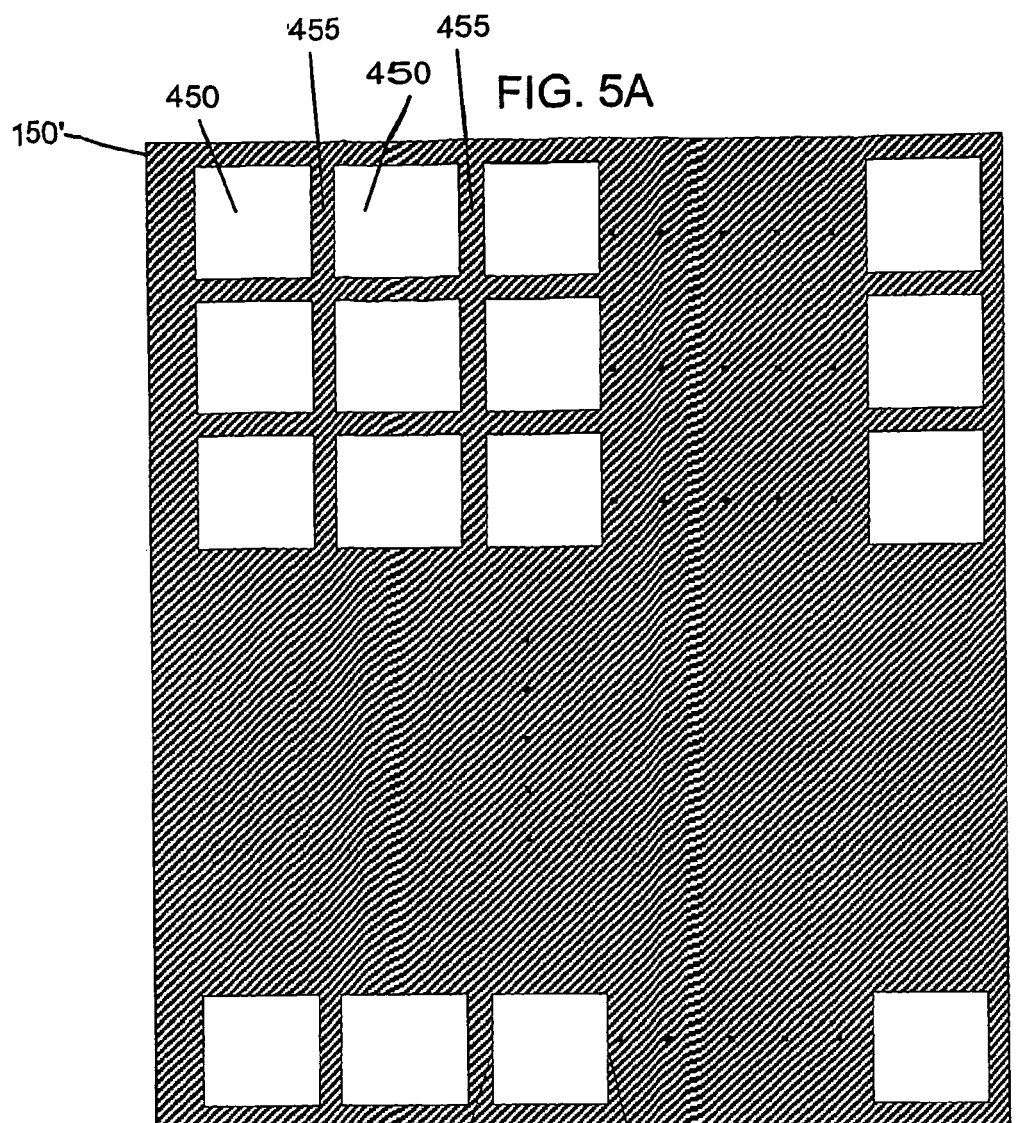
FIG. 5A is a top view of a second exemplary embodiment of the mask according to the present invention which has a beam-blocking area surrounding multiple small open or transparent areas or slits, and which can be used with the exemplary system of FIG. 1A to mask the beam pulses generated by a beam source into patterned beamlets, such that such masked beamlet pulses irradiate the particular areas on the semiconductor film whose edge regions are significantly reduced.
Figure 5B:
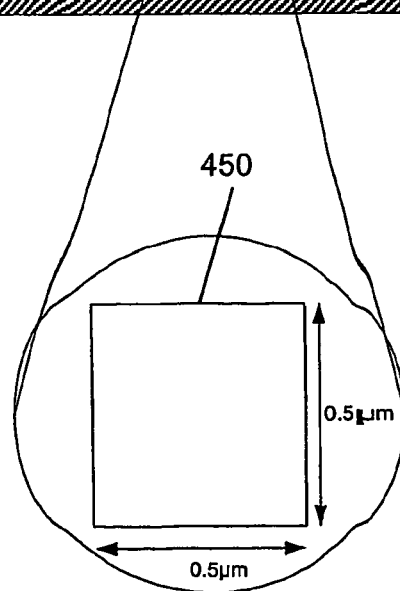
FIG. 5B is an enlarged view of the beamlets of the second embodiment of the mask illustrated in FIG. 5A.

FIGS. 6A-6D show an exemplary progression of a second embodiment of the process according to the present invention in which a plurality of successive areas along the first conceptual column 205 of the semiconductor thin film 175 is irradiated by the masked beam pulse 164 (comprised of beamlets) which is shaped by the mask 150' of FIG. 5A. The translation of the sample 170 with respect to the impingement thereof by the beam pulse 164 is substantially the same as the translation described above with reference to FIGS. 4A-4F. The difference between the irradiation of the areas 310, 320, . . . , 380, 390, 410, 420 by the beam pulse 164 shaped by the mask 150 of FIG. 3 and the areas 460, 470 by the beam pulse 164 shaped by the mask 150' is that substantially the entire areas 310, 320, . . . , 380, 390, 410, 420 are irradiated and crystallized, as opposed to only certain small portions 462 of the areas 460, 470 are irradiated and crystallized.

Figure 6A:
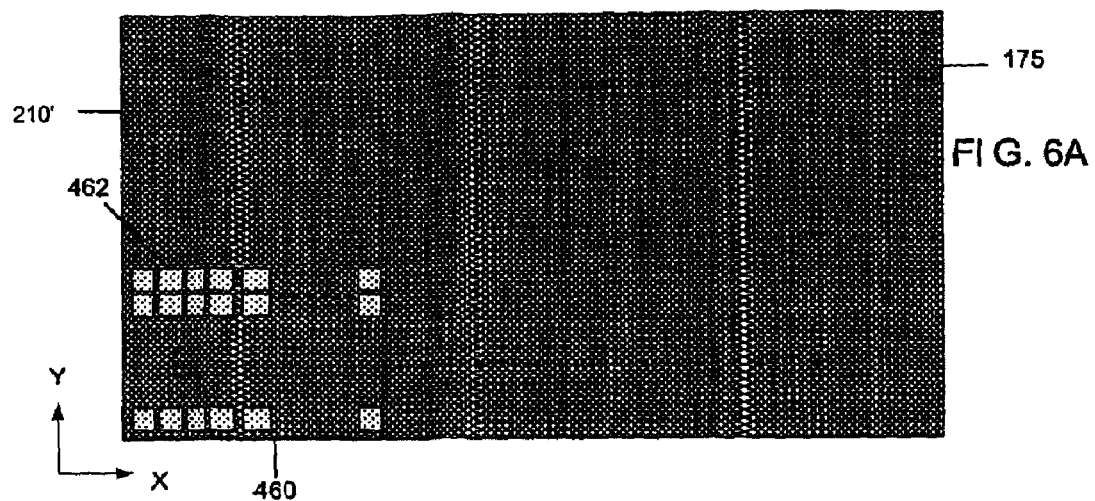
FIGS. 6A-6D are irradiations, by the radiation beam pulse intensity pattern which is masked by the mask of FIG. 5, and then re-solidifications and crystallizations of the particular portions of the semiconductor film provided on the sample for the first conceptual column of the sample at various sequential stages of the first exemplary embodiment of the exemplary embodiment according to the process of the present invention.
Figure 6B:
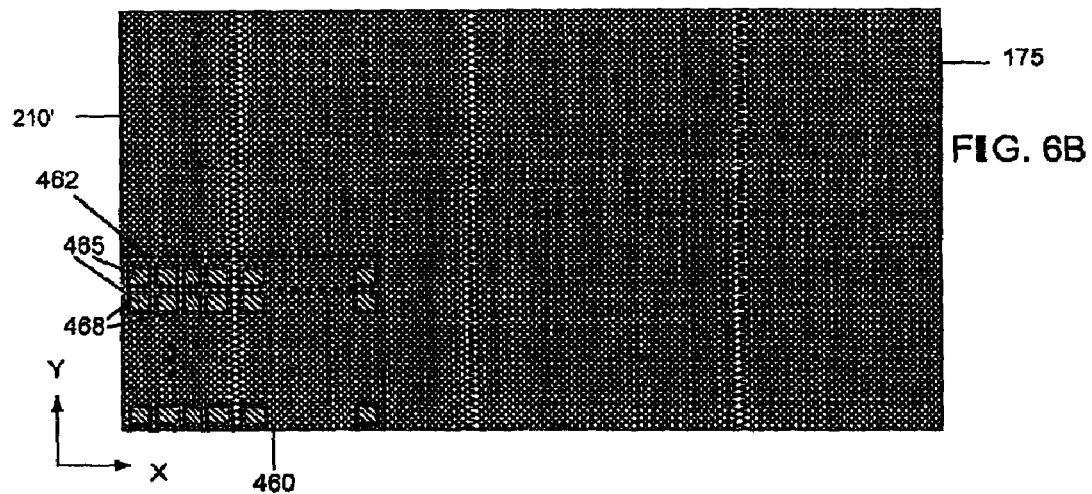
Figure 6C:
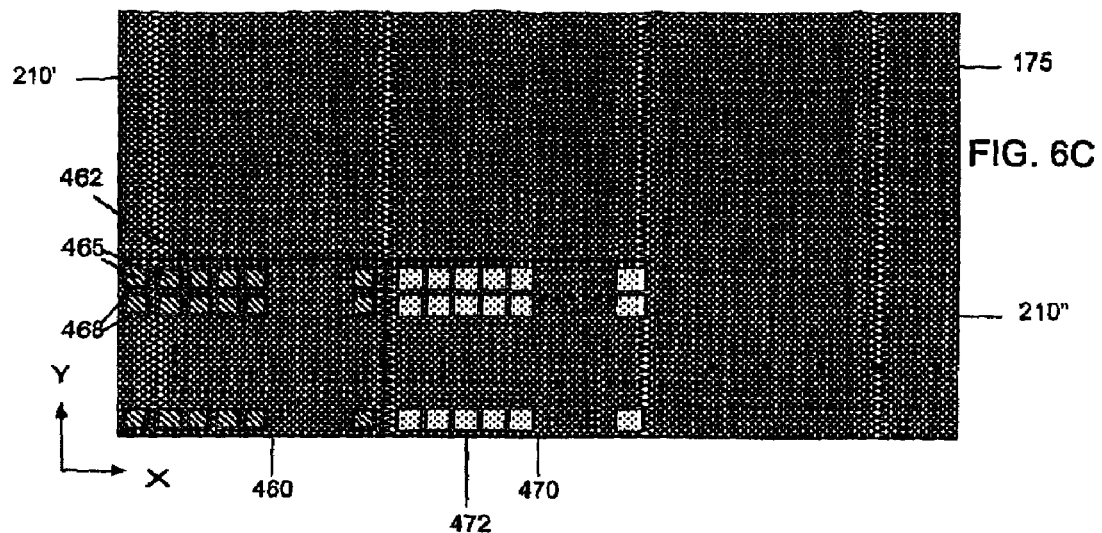

Similarly to the area 310 in FIG. 4A, the portions 462 of the area 460 are irradiated as illustrated in FIG. 6A. Thereafter, the portions 462 are crystallized to form the center regions 465, and the edge regions 468 as shown FIG. 4B. Similarly to the first center regions 315, the center regions 465 of the respective portions 462 have grains therein which are different than the grains of the edge regions 468, and are sized such that at least an active region of the TFT device (and possible the entire TFT device) can be placed away from the edge regions 468. As shown in FIG. 6C, upon the translation of the sample 170) in the −X direction, portions 472 of the area 470 are irradiated and then crystallized in a substantially the same manner as the portions 462. Therefore, the center regions 475 and the edge regions 478 of the area 470 are formed.

Figure 7:
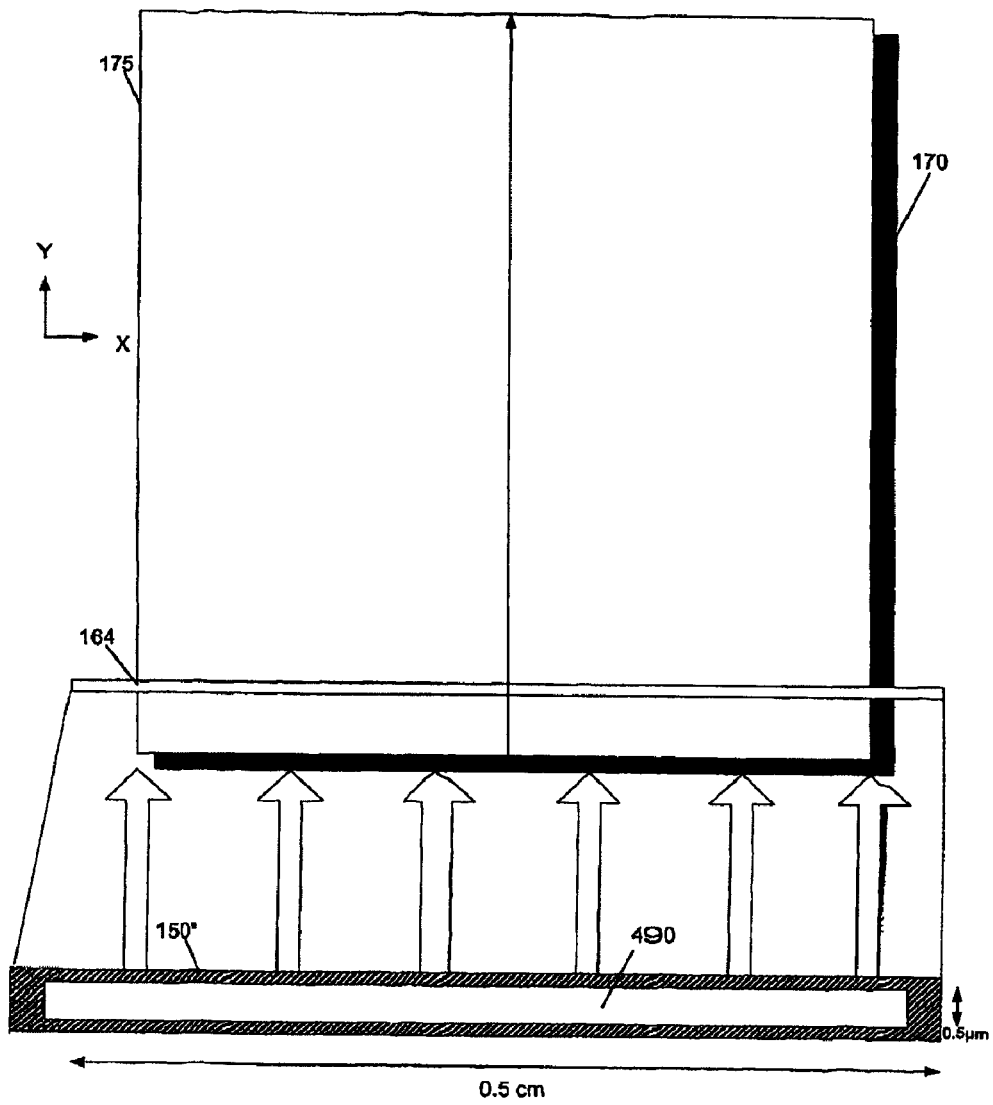
FIG. 7 is an illustration of the semiconductor thin film provided on the sample, and such thin film being irradiated by the beam pulse having a cross-section that is patterned by a mask having a beam-blocking area surrounding one long and narrow open or transparent area, and which can be used with the exemplary system of FIG. 1A.

In addition, it is possible to utilize a third embodiment of a mask 150" according to the present invention as shown in FIG. 7 which has a long and narrow open or transparent region 490 so as to pattern and shape the beam 149 into the beam pulse 164. For example, the length of the region 490 can be 0.5 cm and the width thereof may be 0.1 mm. In this manner, each conceptual column of the sample 170 illustrated in FIG. 2 can be irradiated by the beam pulse 164 shaped by this mask 150". In addition, it may be possible for the length of the region 490 to be 30 cm. Thus, instead of subdividing the semiconductor thin film 175 into a number of conceptual columns, and irradiating each column separately, it is possible to irradiate and crystallize selected portions of the semiconductor thin film 175 by translating the sample 170 in the −Y direction from one edge of the sample 170 to the opposite edge thereof. It is important that the center regions be formed using such processing technique such that it would be possible to keep the active regions of the respective TFT devices at a distance from the edge regions.

Figure 6D:
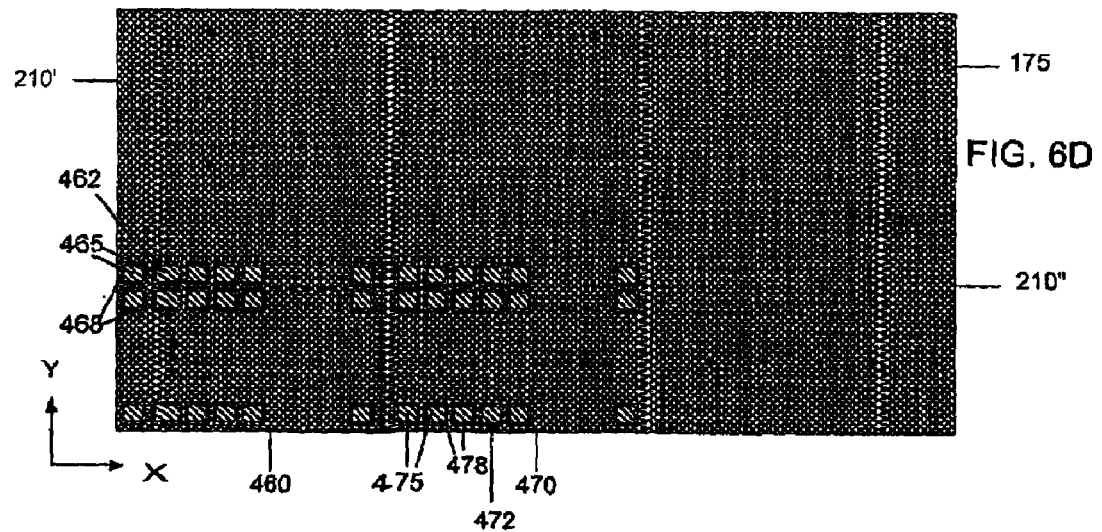
Figure 8A:
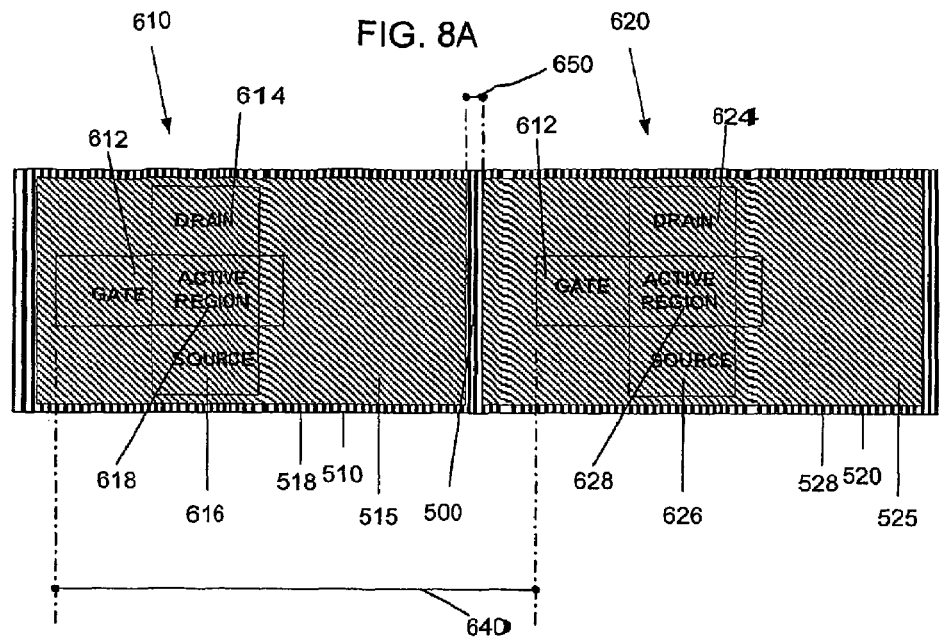
FIG. 8A is an illustration of the two particular areas irradiated, re-solidified and crystallized areas corresponding to the areas of FIGS. 4D and 6D in which the edge regions of each of these areas are provided away from the entire TFT device.

FIG. 8A shows an illustration of the first and second irradiated and crystallized areas 510 and 520 possibly corresponding to the first and second areas 310, 320 of FIG. 4D and/or the adjacent portions 462 of the area 460 of FIG. 6D. In particular, FIG. 8A shows that the entire TFT devices 610 and 620 can be situated away from the edge regions 518, 528, 650, and possibly within the respective center regions 515, 525 of the areas 510, 520. The first TFT device 610 situated in the center region 515 of the area 510 includes a gate 612, a drain 614, a source 616 and an active region 618, all of which are situated away from the edge region 518. Similarly, for the second TFT device 610, its gate 622, drain 624, source 626, and especially active region 628 are also situated away from the edge regions 528, 650 such that they do not overlap the respective edge region 528 of the area 520, and the edge region 650 which is provided between the center regions 515, 525.

Figure 8B:
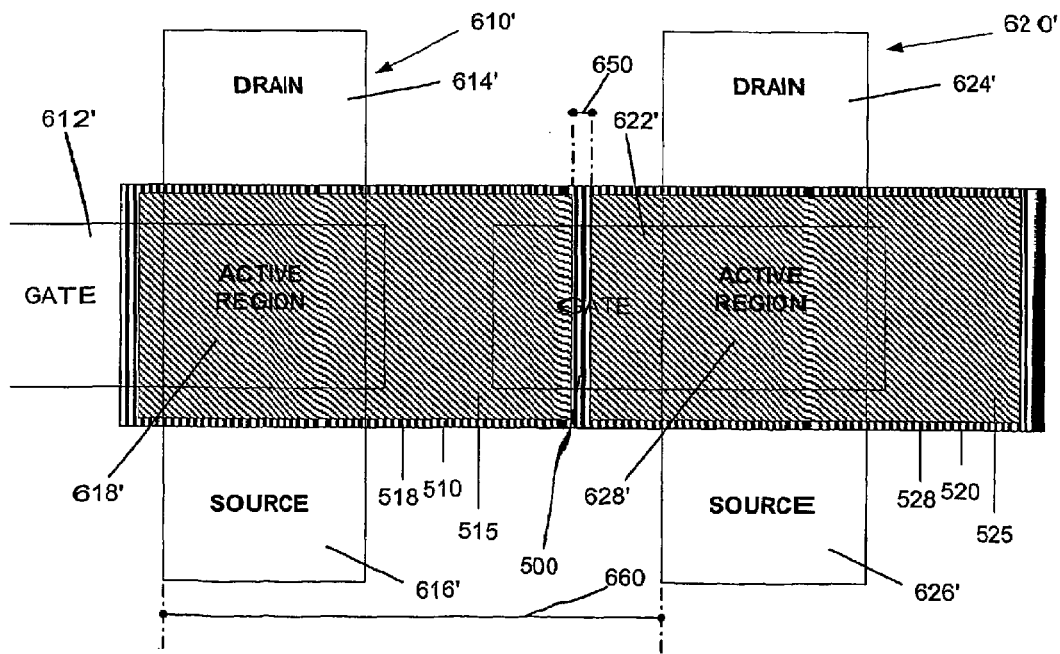
FIG. 8B is an illustration of the two particular areas irradiated, re-solidified and crystallized areas corresponding to the areas of FIGS. 4D and 6D in which the edge regions of these two areas are provided away from the entire cross-section of the active region of the TFT device, while other regions are provided on such edge regions.

FIG. 8B shows an illustration of the first and second irradiated and crystallized areas 510 and 520 also possibly corresponding to the adjacent portions 462 of the area 460 of FIG. 6D with the respective TFT devices 610, 620' provided thereon. In this exemplary embodiment, only respective active regions 618', 628' of the areas 510, 520 are provided away from the edge regions 518, 528, 650, and are provided within the respective uniform center regions 515, 525 of the areas 510, 520, while other portions of the TFT devices 610', 620' are situated on the respective edge regions 518, 528 of the areas 510, 520, and the edge area provided there between. In particular, the first TFT device 610' includes an active region 618' which entirely situated in the center region 515 of the area 510, while a gate 612', a drain 614' and a source 616' of the TFT device 610' overlap the edge region 518. Similarly, for the second TFT device 610', an active region 628' thereof is entirely situated within the respective center region 525 of the area 520, while a gate 622', a drain 624' and a source 626 of the second TFT device 620' are provided directly on the respective edge regions 528 of the area 520. Also, the gate 622' is provided on a border region 500 (i.e., the edge region 650 between the areas 510, 520) between the center region 515 of the area 510 and the center region 525 of the area 520. It should be understood that any one of the gate 612, 612', 622, 622' drain 614, 614', 624, 624' and source 616, 616', 626, 626' can be provided on the edge regions 518, 528 and the border region 500.

By using this exemplary embodiment of the present invention, the edge region 500 and/or the width of the edge regions 518, 528 associated with such edge region 500 can be reduced to 1 μm, which is approximately 100 to 10,000 smaller than the edge regions obtained using the conventional systems and process. Therefore, it would be possible to achieve the placement of the entire TFT device 610, 620 in the center regions 515, 525 such that the distance between which would be greater that the edge region 500, as illustrated in FIG. 8A.

Similar applies for the placement of the TFT devices 610', 620' as shown in FIG. 8B, except that the distance between the active regions 618', 628' of the respective TFT devices 610', 620' would be greater than the width of the edge region 500.

Figure 9:
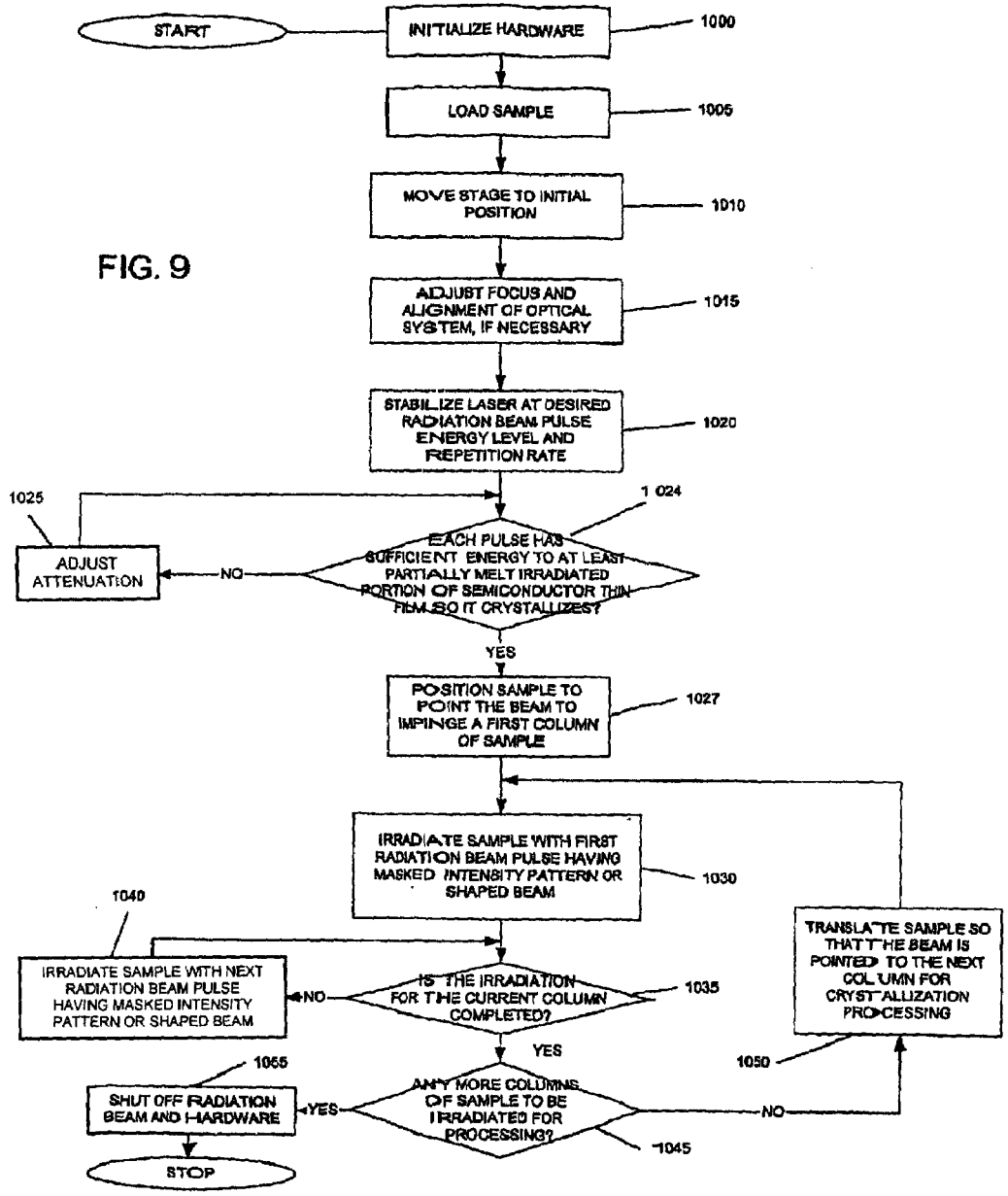
FIG. 9 is a flow diagram representing an exemplary processing procedure of the present invention under at least partial control of a computing arrangement of FIG. 1A using the exemplary techniques of the present invention of FIGS. 4A-4F and 6A-6D.

FIG. 9 is a flow diagram representing a first exemplary processing procedure of the present invention under at least a partial control of a computing arrangement of FIG. 1A using the techniques of the present invention of FIGS. 4A-4F and 6A-6D. In step 1000, the hardware components of the system of FIG. 1A, such as the beam source 110, the energy beam modulator 120, and the beam attenuator and shutter 130 are first initialized at least in part by the computing arrangement 100. The sample 170 is loaded onto the sample translation stage 1800 in step 1005. It should be noted that such loading may be performed either manually or automatically using known sample loading apparatus under the control of the computing arrangement 100. Next, the sample translation stage 180 is moved, preferably under the control of the computing arrangement 100, to an initial position in step 1010. Various other optical components of the system are adjusted and/or aligned either manually or under the control of the computing arrangement 100 for a proper focus and alignment in step 1015, if necessary. In step 1020, the irradiation/laser beam 111 is stabilized at a predetermined pulse energy level, pulse duration and repetition rate. In step 1024, it is preferably determined whether each beam pulse has sufficient energy to irradiate the portions of the semiconductor thin film so as to crystallize such portions thereafter. If that is not the case, the attenuation of the beam 111 is adjusted by the beams source 110 under the control of the computing arrangement 100 in step 1025, and step 1024 is executed again to determine if the there is sufficient energy to crystallize the portions of the semiconductor thin film.

In step 1027, the sample is positioned to point the beam pulse 164 to impinge the first column of the semiconductor thin film. Then, in step 1030, the portions of the semiconductor thin film are irradiated using a masked intensity pattern (e.g., the masked beam pulse 164). Thereafter, the irradiated portions of the semiconductor thin film are crystallized with the minimized edge regions therein so as to allow at least the active regions of the TFT devices to be placed away from such edge regions. In step 1035, it is determined whether the irradiation for the current column by the beam pulse has been completed. If no, in step 1040, the sample is continued to be irradiated with the next beam pulse 164. However, if in step 1035, it is determined that the irradiation and crystallization of the current column is completed, then it is determined in step 1040 whether there are any further columns of the sample to be processed. If so, the process continues to step 1050 in which the sample is translated to that the beam pulse is pointed to the next column to be processed according to the present invention. Otherwise, in step 1055, the exemplary processing has been completed for the sample 170, and the hardware components and the beam 111 of the system shown in FIG. 1A can be shut off, along with the process terminating.

Figure 10:
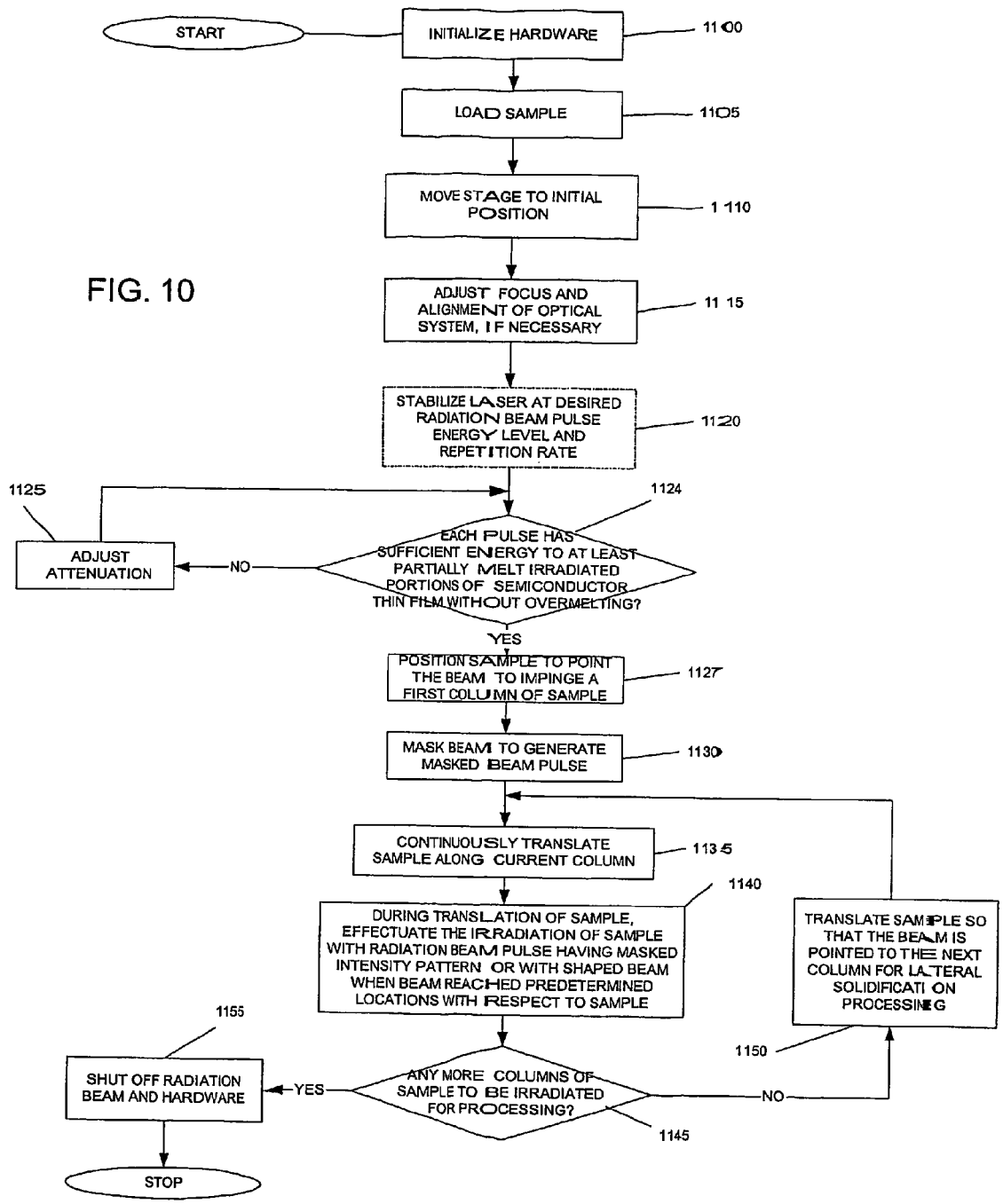
FIG. 10 is a flow diagram representing another exemplary processing procedure of the present invention under at least partial control of a computing arrangement of FIG. 1A using the exemplary techniques of the present invention of FIGS. 4A-4F and 6A-6D, and in which the beam source of FIG. 1A is triggered based on the positions of the semiconductor film with respect to the impingement of the beam.

FIG. 10 is a flow diagram representing a second exemplary processing procedure of the present invention under at least a partial control off a computing arrangement of FIG. 1A using the techniques of the present invention of FIGS. 4A-4F and 6A-6D, in which is preferable to mask the beam 111. Steps 1100-1120 of this exemplary procedure are substantially the same as the steps 1000-1020 of the procedure of FIG. 9 and thus shall not be described herein in further detail. In step 1024, however, it is determined whether each pulse has enough energy to irradiate at least portions of the semiconductor thin film 175 such that the irradiated portion crystallize. If not, in step 1125, the attenuation for the beam pulse is adjusted, and the energy fluence is verified again. Upon the verification of the energy fluence of the beam pulse, the sample is moved to impinge a first column of the sample 170.

Then, in step 1130, the resultant beam 149 is passed through a mask 159 to shape the beam pulse, and shape the edge portions of the resultant pulse. Then, the sample 170 is continuously translated along the current column in step 1135, In step 1140, during the translation of the sample 170, the portions of the semiconductor thin film are irradiated and at least partially melted using a masked intensity pattern beam pulse to allow the irradiated portions to crystallize. This irradiation of these portion of the semiconductor thin film 175 can be performed when the beam pulses reach particular locations on the sample, which are pre-assigned by the computing arrangement 100. Thus, the beam source can be fired upon the sample reaching these locations with respect to the beam pulses. Thereafter, the irradiated portions of the semiconductor thin film are allowed to crystallize such that the certain areas of the solidified portions have been nucleated and include uniform material therein so as to allow the distance between at least the active regions of the TFT devices to be greater that the edge regions of such irradiated areas. Such processing is continued until the end of the current column on the semiconductor thin film 175 is reached. In step 1145, it is determined whether there are any further columns of the sample to be processed. If so, the process continues to step 1150 in which the sample is translated to that the beam pulse is pointed to the next column to be processed according to the present invention. Otherwise, in step 1155 is performed, which is substantially the same as that of step 1055 of FIG. 9.

The foregoing merely illustrates the principles of the invention. Various modifications and alterations to the described embodiments will be apparent to those skilled in the art in view of the teachings herein. For example, while the above embodiment has been described with respect to irradiation and crystallization of the semiconductor thin film, it may apply to other material processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the above-referenced patent application can also be utilized with the process and system of the present invention. It will thus be appreciated that those skilled in the art will be able to devise numerous systems and methods which, although not explicitly shown or described herein, embody the principles of the invention and are thus within the spirit and scope of the present invention.

What is claimed is:

1. A method for processing a thin film sample, comprising the steps of:
   (a) controlling a beam generator to emit at least one beam pulse;
   (b) masking the at least one beam pulse to produce at least one masked beam pulse, wherein the at least one masked beam pulse is used to irradiate at least one portion of the thin film sample;
   (c) with the at least one masked beam pulse, irradiating the at least one portion of the film sample with sufficient intensity to completely melt the at least one portion of the thin film sample throughout its thickness and across its entire area; and
   (d) allowing the at least one portion of the film sample to crystallize, the crystallized at least one portion being composed of a first area, having a predetermined distance, and a second area, having a width, wherein, upon the crystallization thereof, the first area includes a first set of grains, and the second area includes a second set of grains whose at least one characteristic is different from at least one characteristic of the first set of grains,
   wherein the first area surrounds the second area, and is configured to allow an active region of an electronic device to be provided at a distance therefrom and sized such that a the predetermined distance of the first area is at least ten times smaller than a the width of the second area.

2. The method according to claim 1, wherein the active region of the TFT is situated within the second area.

3. The method according to claim 1, wherein the second area corresponds to at least one pixel.

4. The method according to claim 1, wherein the second area has a cross-section for facilitating thereon all portions of the TFT.

5. The method according to claim 1, wherein a size and a position of the first area with respect to the second area are provided such that the first area provides either no effect or a negligible effect on a performance of the TFT.

6. The method according to claim 1, further comprising the step of:
   (e) after step (d), determining a location of the first area so as to avoid a placement of the active region of the TFT thereon.

7. The method according to claim 1, wherein the at least one beam pulse includes a plurality of beamlets, and wherein the first and second areas are irradiated by the beamlets.

8. The method according to claim 1, wherein the thin film sample is a silicon thin film sample.

9. The method according to claim 1, wherein the thin film sample is composed of at least one of silicon and germanium.

10. The method according to claim 1, wherein the thin film sample has a thickness approximately between 100 Å and 10,000 Å.

11. The method according to claim 1, wherein the first set of grains provided in the first area are laterally-grown grains.

12. The method according to claim 11, wherein the laterally-grown grains of the first area are equiaxed grains.

13. The method according to claim 1, wherein the electronic device is a thin-film transistor ("TFT").

14. The method according to claim 1, wherein the thin film sample is a semiconductor thin film sample.

* * * * *